US012721134B2

(12) United States Patent
Chen et al.

(10) Patent No.: US 12,721,134 B2
(45) Date of Patent: Aug. 25, 2026

(54) CONDUCTIVE STRUCTURES OF INTEGRATED CIRCUITS

(71) Applicant: Taiwan Semiconductor Manufacturing Company, Ltd, Hsinchu (TW)

(72) Inventors: Tzu Pei Chen, Taipei City (TW); Sung-Li Wang, Hsinchu County (TW); Shin-Yi Yang, New Taipei City (TW); Po-Chin Chang, Taichung City (TW); Yuting Cheng, Taoyuan City (TW); Chia-Hung Chu, Taipei City (TW); Chun-Hung Liao, Taichung (TW); Harry Chien, Chandler, AZ (US); Chia-Hao Chang, Hsinchu City (TW); Pinyen Lin, Rochester, NY (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 315 days.

(21) Appl. No.: 18/221,638

(22) Filed: Jul. 13, 2023

(65) Prior Publication Data

US 2025/0022802 A1 Jan. 16, 2025

(51) Int. Cl.
*H10W 20/20* (2026.01)
*H10W 20/00* (2026.01)

(52) U.S. Cl.
CPC ......... *H10W 20/20* (2026.01); *H10W 20/033* (2026.01); *H10W 20/062* (2026.01); *H10W 20/0698* (2026.01); *H10W 20/077* (2026.01); *H10W 20/083* (2026.01)

(58) Field of Classification Search
CPC ......... H01L 21/76816; H01L 21/76895; H01L 21/76804; H01L 21/76802; H01L 21/76805; H01L 21/76831; H01L 21/76832; H10D 84/985; H10D 84/987; H10D 84/988; H10W 20/20; H10W 20/033; H10W 20/062; H10W 20/0698; H10W 20/077; H10W 20/083; H10W 20/056
See application file for complete search history.

(56) References Cited

U.S. PATENT DOCUMENTS 9,093,530 B2 7/2015 Huang et al.
9,105,490 B2 8/2015 Wang et al.
9,147,748 B1 * 9/2015 Xie ..................... H10D 64/017
9,171,929 B2 10/2015 Lee et al.
9,214,555 B2 12/2015 Oxland et al.
9,236,267 B2 1/2016 De et al.
9,236,300 B2 1/2016 Liaw
9,406,804 B2 8/2016 Huang et al.
(Continued)

*Primary Examiner* — Thanhha S Pham
(74) *Attorney, Agent, or Firm* — Sterne, Kessler, Goldstein & Fox P.L.L.C.

(57) ABSTRACT

An integrated circuit (IC) with conductive structures and a method of fabricating the IC are disclosed. The method includes depositing a first dielectric layer on a semiconductor device, forming a conductive structure in the first dielectric layer, removing a portion of the first dielectric layer to expose a sidewall of the conductive structure, forming a barrier structure surrounding the sidewall of the conductive structure, depositing a conductive layer on the barrier structure, and performing a polishing process on the barrier structure and the conductive layer.

20 Claims, 29 Drawing Sheets

(56) References Cited

U.S. PATENT DOCUMENTS

| | | | | |
|---|---|---|---|---|
| 9,443,769 | B2 | 9/2016 | Wang et al. | |
| 9,520,482 | B1 | 12/2016 | Chang et al. | |
| 9,548,303 | B2 | 1/2017 | Lee et al. | |
| 9,548,366 | B1 | 1/2017 | Ho et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 9,831,183 | B2 | 11/2017 | Lin et al. | |
| 9,859,386 | B2 | 1/2018 | Ho et al. | |
| 2016/0343708 | A1* | 11/2016 | Park | H10D 30/6219 |
| 2020/0006127 | A1 | 1/2020 | Khaderbad et al. | |
| 2022/0165846 | A1 | 5/2022 | Huang et al. | |
| 2022/0223526 | A1* | 7/2022 | Min | H01L 23/535 |
| 2022/0367265 | A1* | 11/2022 | Hsieh | H01L 21/76882 |
| 2023/0072315 | A1 | 3/2023 | Park et al. | |
| 2023/0072614 | A1 | 3/2023 | Qu et al. | |
| 2023/0154792 | A1 | 5/2023 | Chin et al. | |
| 2023/0178473 | A1* | 6/2023 | Chou | H01L 21/76807 257/774 |

* cited by examiner

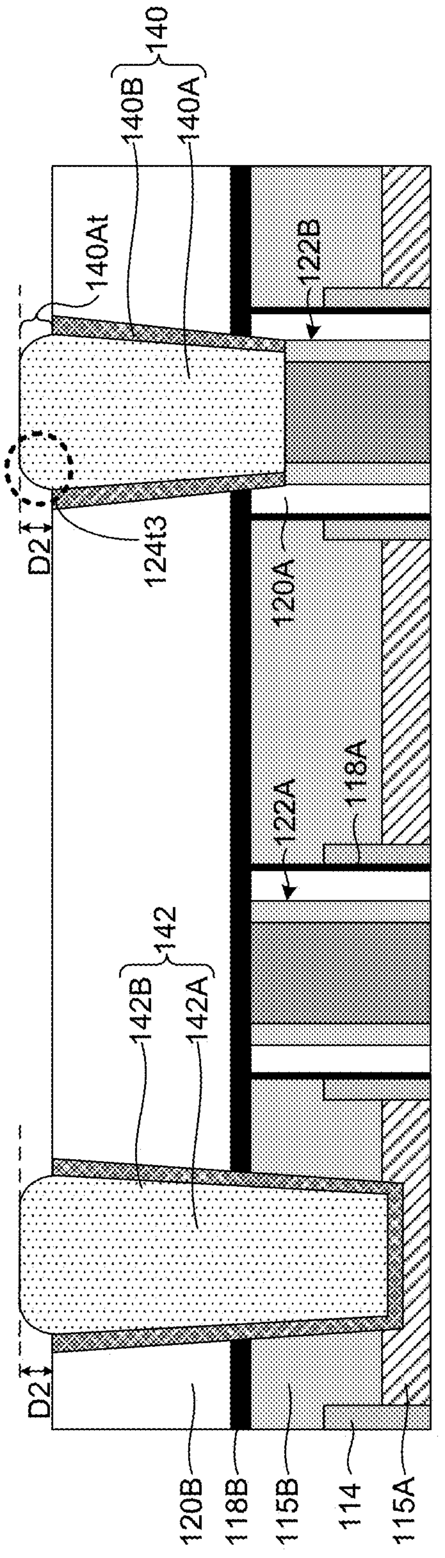
Fig. 21
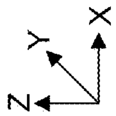

CONDUCTIVE STRUCTURES OF INTEGRATED CIRCUITS

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), fin field effect transistors (finFETs), and gate-all-around (GAA) FETs in integrated circuit (IC) chips. The scaling down has increased the complexity of manufacturing ICs.

BRIEF DESCRIPTION OF THE DRAWINGS

Aspects of this disclosure are best understood from the following detailed description when read with the accompanying figures.

FIGS. 3-21 illustrate cross-sectional views of an IC with conductive structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
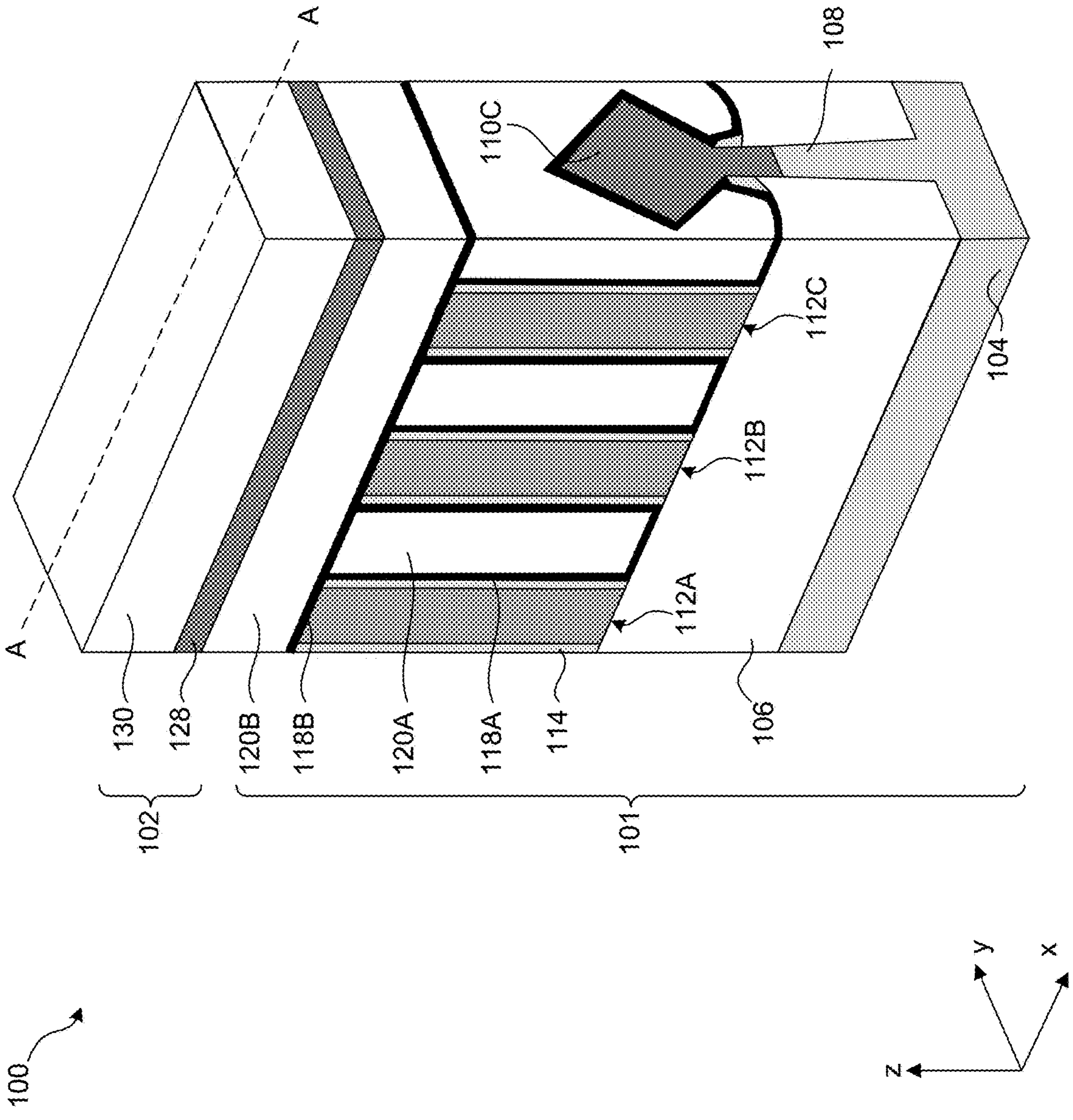
FIG. 1A illustrates an isometric view of an IC, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% to 20% of the value (e.g., ±1%, ±2%, ±3%, ±4%, ±5%, ±6%, ±7%, ±8%, ±8%, ±9%, ±10~15%, ±15~20% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The GAA transistor structures may be patterned by any suitable method. For example, the structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA transistor structure.

The increasing demand for small, portable multifunctional electronic devices has increased the demand for low power devices that can perform increasingly complex and sophisticated functions while providing ever-increasing storage capacity. As a result, there is a continuing trend in the semiconductor industry to manufacture low-cost, high-performance, and low-power integrated circuits (ICs) with semiconductor devices and interconnect structures. These goals have been achieved in large part by scaling down the dimensions of the semiconductor devices and/or interconnect structures. However, continued scaling of interconnect lines of interconnect structures introduces considerable challenges, such as increased resistance of interconnect lines and increased metal diffusion from interconnect lines to underlying contact structures of semiconductor devices.

To address the abovementioned challenges, the present disclosure provides example ICs with barrier structures in interconnect lines of interconnect structures to reduce resistance of interconnect lines and to minimize or prevent metal diffusion from liners and/or plugs in interconnect lines to underlying contact structures of semiconductor devices (e.g., gate-all-around (GAA) FETs or finFETs). In addition, the present disclosure provides example methods of forming the ICs. In some embodiments, an interconnect line can be disposed on a contact structure and an interlayer dielectric (ILD) layer surrounding the contact structure of a semiconductor device. The interconnect line can include a barrier structure having an interconnect portion and a contact portion. The interconnect portion can surround an interconnect liner and/or plug of the interconnect line and can have a thin profile with a thickness of about 0.5 nm to about 3 nm to reduce the resistance of the interconnect line.

Due to the thin profile of the interconnect portion, there may be non-uniformity in the bottom portion thickness of the interconnect portion. The thickness non-uniformity can be on the underlying interfaces between the contact structure and the ILD layer. Such thickness non-uniformity may lead to metal diffusion from the interconnect liner and/or plug to the contact structure through top edges and/or sidewalls of the contact structure. The presence of the contact portion can prevent or minimize such metal diffusion to the contact structure and improve IC performance. The contact portion can extend from a bottom surface of the interconnect portion and surround a top portion of the contact structure, thus providing metal diffusion barrier at the top edges and/or sidewalls of the contact structure. In some embodiments, the contact portion can have a thickness of about 0.5 nm to about 2 nm and can extend a distance of about 10% to about 50% of a thickness of the ILD layer.

FIG. 1A illustrates an isometric view of an IC 100 with a FET 101 and an interconnect structure 102 disposed on FET 101, according to some embodiments. FIGS. 1B-1I illustrate different cross-sectional views of IC 100 along line A-A of FIG. 1A, according to some embodiments. FIGS. 1B-1I illustrate cross-sectional views of IC 100 with additional structures that are not shown in FIG. 1A for simplicity. FIGS. 1C-1H illustrate enlarged views of region 103 of FIGS. 1B and 1I for different cross-sectional views of IC 100 along line A-A of FIG. 1A. The discussion of elements in FIGS. 1A-1I with the same annotations applies to each other, unless mentioned otherwise. In some embodiments, FET 101 can represent n-type FET 101 (NFET 101) or p-type FET 101 (PFET 101) and the discussion of FET 101 applies to both NFET 101 and PFET 101, unless mentioned otherwise.

Figure 1B:
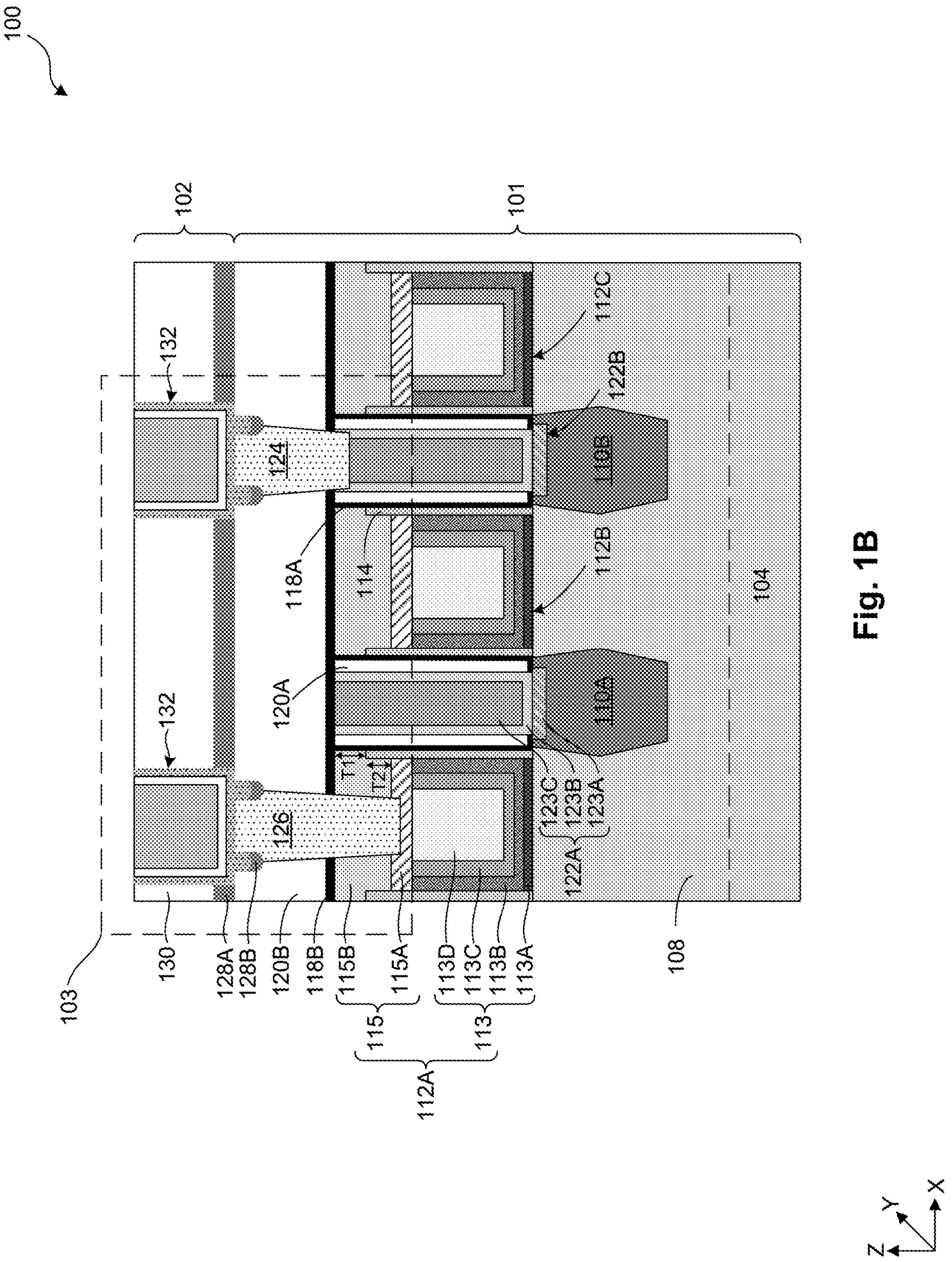
FIGS. 1B-1I illustrate different cross-sectional views of an IC with conductive structures, in accordance with some embodiments.

Referring to FIGS. 1A and 1B, in some embodiments, FET 101 can include (i) a substrate 104, (ii) shallow trench isolation (STI) regions 106 disposed on substrate 102, (iii) a fin structure 108 disposed on substrate 102, (iv) S/D regions 110A-110C disposed on fin structure 108 (S/D region 110C visible in FIG. 1A; 110A-110B visible in FIGS. 1B and 1I), (v) gate structures 112A-112C disposed on fin structure 108, (vi) gate spacers 114 disposed on gate structures 112A-112C, (vii) first etch stop layers (ESLs) 118A disposed on S/D regions 110A-110C, (viii) first ILD layers 120A disposed on first ESLs 118A, (ix) a second ESL 118B disposed on first ESLs 118A and first ILD layers 120A, (x) a second ILD layer 120B disposed on second ESL 118B, (xi) S/D contact structures 122A and 122B disposed on S/D regions 110A and 110B, respectively, (xii) a via structure 124 disposed on contact structure 122B, and (xiii) a gate contact structure 126 disposed on gate structure 112A. The discussion of S/D regions 110A-110C applies to each other, the discussion of gate structures 112A-112C applies to each other, and the discussion of contact structure 122A and 122B applies to each other, unless mentioned otherwise. S/D regions 110A-11C may refer to a source or a drain, individually or collectively dependent upon the context. The discussion of via structure 124 applies to gate contact structure 126, unless mentioned otherwise.

In some embodiments, substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, STI regions 106, gate spacers 114, ESLs 118A, and ILD layers 120A can include an insulating material, such as silicon oxide ($SiO_2$), silicon nitride (SiN), silicon oxynitride (SiON), silicon oxycarbide (SiOC), silicon carbon nitride (SiCN), silicon oxycarbon nitride (SiOCN), and silicon germanium oxide ($SiGeO_x$). In some embodiments, ESL 118B and ILD layer 120B can include a dielectric material, such as such as lanthanum oxide (LaO), aluminum oxide ($Al_2O_3$), yttrium oxide ($Y_2O_3$), tantalum carbon nitride (TaCN), zirconium silicide (ZrSi), SiOCN, SiOC, SiCN, zirconium nitride (ZrN), zirconium aluminum oxide (ZrAlO), $TiO_2$, $Ta_2O_3$, $ZrO_2$, $HfO_2$, SiN, hafnium silicide (HfSi), aluminum oxynitride (AlON), $SiO_2$, SiC, and zinc oxide (ZnO). In some embodiments, ESL 118B can have a thickness of about 3 nm to about 40 nm and ILD layer 120B can have a thickness of about 3 nm to about 50 nm along a Z-axis for adequate electrical isolation between via structure 124 and gate contact structure 126.

In some embodiments, fin structures 108 can include a material similar to substrate 104. Fin structures 108 can have elongated sides extending along an X-axis. For NFET 101, S/D regions 110A-110C can include an epitaxially-grown semiconductor material, such as Si, and n-type dopants, such as phosphorus and other suitable n-type dopants. For PFET 101, S/D regions 110A-110C can include an epitaxially-grown semiconductor material, such as Si and SiGe, and p-type dopants, such as boron and other suitable p-type dopants.

In some embodiments, each of gate structures 112A-112C can include a gate stack 113 disposed on fin structure 108 and a gate capping structure 115 disposed on gate stack 113. In some embodiments gate stack 113 can include (i) an interfacial oxide (IL) layer 113A, (ii) a high-k (HK) gate dielectric layer 113B disposed on IL layer 113A, (iii) a work function metal (WFM) layer 113C disposed on HK gate dielectric layer 113B, and (iv) a gate metal fill layer 113D disposed on WFM layer 113C. In some embodiments, each of gate structures 112A-112C can have a gate length of about 2 nm to about 50 nm along an X-axis.

In some embodiments, IL layer 113A can include $SiO_2$, $SiGeO_x$, or germanium oxide ($GeO_x$). In some embodiments, HK gate dielectric layer 113B can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). In some embodiments, WFM layer 113C can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, or other suitable Al-based materials for n-type FET 106A. In some embodiments, WFM layer 113C can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, and tantalum copper (Ta—Cu) for p-type FET 106A. In some embodiments, gate metal fill layer 113D can include a suitable conductive material, such as tungsten (W), titanium (Ti), silver (Ag), ruthenium (Ru), molybdenum (Mo), copper (Cu), cobalt (Co), Al, iridium (Ir), nickel (Ni), metal alloys, and a combination thereof.

In some embodiments, each of gate capping structures 115 can include a conductive gate cap 115A disposed on gate stack 113 and an insulating gate cap 115B disposed on conductive gate cap 115A. Insulating gate cap 115B protects the underlying conductive gate cap 115A and gate stack 113 from structural and/or compositional degradation during subsequent processing of FET 101. In some embodiments, insulating gate cap 115B can include a dielectric material, such as LaO, $Al_2O_3$, $Y_2O_3$, TaCN, ZrSi, SiOCN, SiOC, SiCN, ZrN, ZrAlO, $TiO_2$, $Ta_2O_3$, $ZrO_2$, $HfO_2$, SiN, HfSi, AlON, $SiO_2$, SiC, and ZnO. In some embodiments, a top portion of insulating gate cap 115B can have a thickness T1 of about 1 nm to about 30 nm and a bottom portion of insulating gate cap 115B can have a thickness T2 of about 1 nm to about 50 nm for adequate protection of the underlying conductive gate cap 115A and gate stack 113. In some embodiments, insulating gate cap 115B may not have its top portion on gate spacers 114 and have its bottom portion between gate spacers 114 and vice versa.

Conductive gate cap 115A provides a conductive interface between gate stack 113 and gate contact structure 126 to electrically connect gate stack 113 to gate contact structure 126 without forming gate contact structure 126 directly on or within gate stack 113. Gate contact structure 126 is not formed directly on or within gate stack 132 to prevent contamination of gate stack 113 by any of the processing materials used in the formation of gate contact structure 126. In some embodiments, conductive gate cap 115A can include a metallic material, such as W, Ru, Ir, Mo, other suitable metallic materials, and a combination thereof. In some embodiments, conductive gate cap 115A can have a thickness of about 1 nm to about 10 nm along a Z-axis for adequately controlling the depth profile of gate contact structure 126.

In some embodiments, each of S/D contact structures 122A and 122B can include (i) a silicide layer 123A disposed within each of S/D regions 110A and 110B, (ii) an adhesion layer 123B disposed on silicide layer 123A, and (iii) a contact plug 123C disposed on adhesion layer 123B. In some embodiments, for NFET 101, silicide layers 123A can include titanium silicide ($Ti_xSi_y$), tantalum silicide ($Ta_xSi_y$), molybdenum ($Mo_xSi_y$), zirconium silicide ($Zr_xSi_y$), hafnium silicide ($Hf_xSi_y$), scandium silicide ($Sc_xSi_y$), yttrium silicide ($Y_xSi_y$), terbium silicide ($Tb_xSi_y$), lutetium silicide ($Lu_xSi_y$), erbium silicide ($Er_xSi_y$), ybtterbium silicide ($Yb_xSi_y$), europium silicide ($Eu_xSi_y$), thorium silicide ($Th_xSi_y$), other suitable metal silicide materials, or a combination thereof. In some embodiments, for PFET 101, silicide layers 123A can include nickel silicide ($Ni_xSi_y$), cobalt silicide ($Co_xSi_y$), manganese silicide ($Mn_xSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), other suitable metal silicide materials, or a combination thereof.

In some embodiments, adhesion layers 123B (also referred to as "liners" or "glue layers") can include a metal nitride, such as titanium nitride (TiN), tantalum nitride (TaN), and other suitable metal nitride materials. In some embodiments, contact plugs 123C can include conductive materials with low resistivity (e.g., resistivity of about 50 μΩ-cm or less), such as W, Ru, Al, Mo, Ir, Ni, Co, Osmium (Os), rhodium (Rh), other suitable conductive materials with low resistivity, and a combination thereof.

Figure 1C:
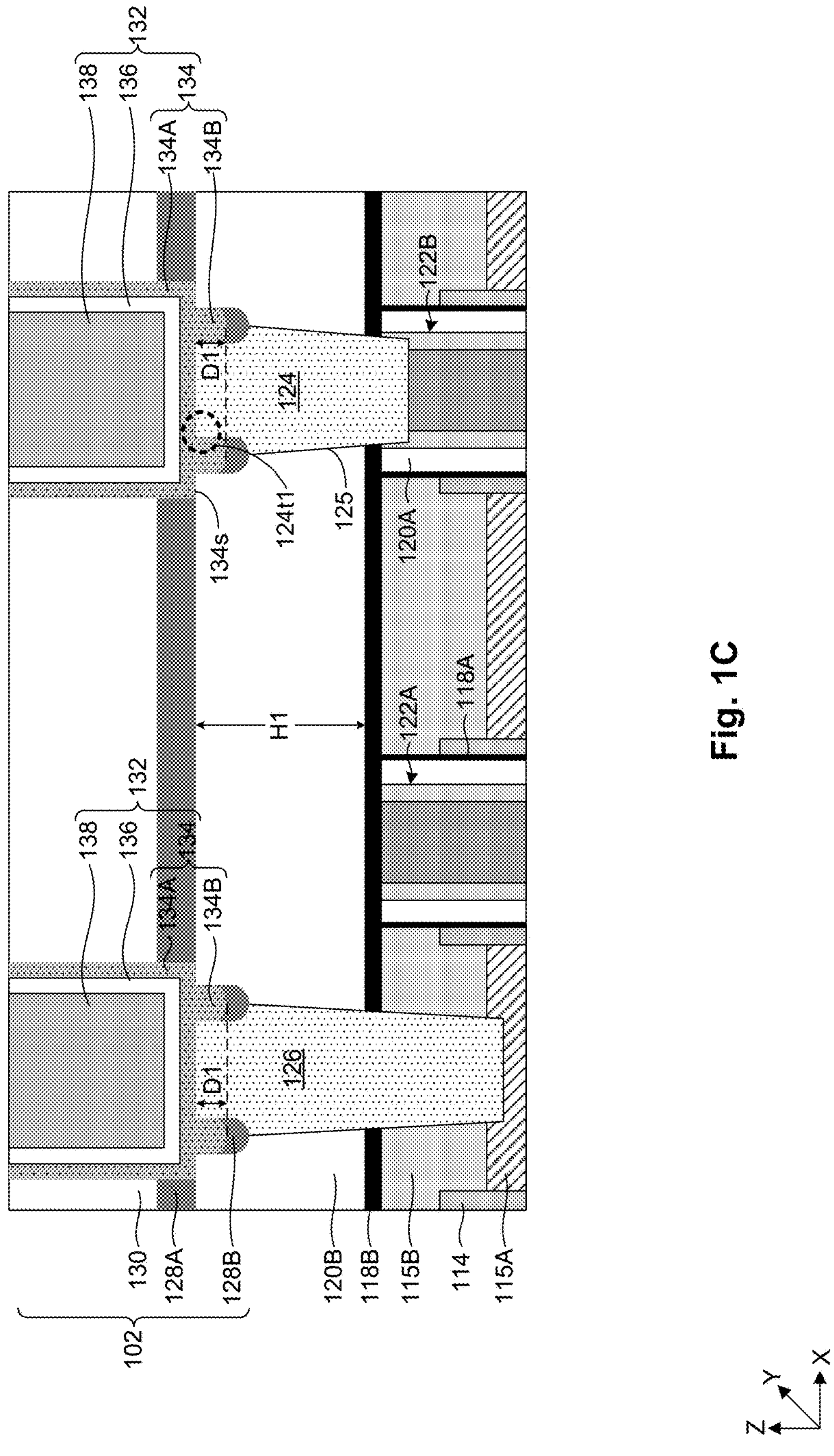
Figure 1D:
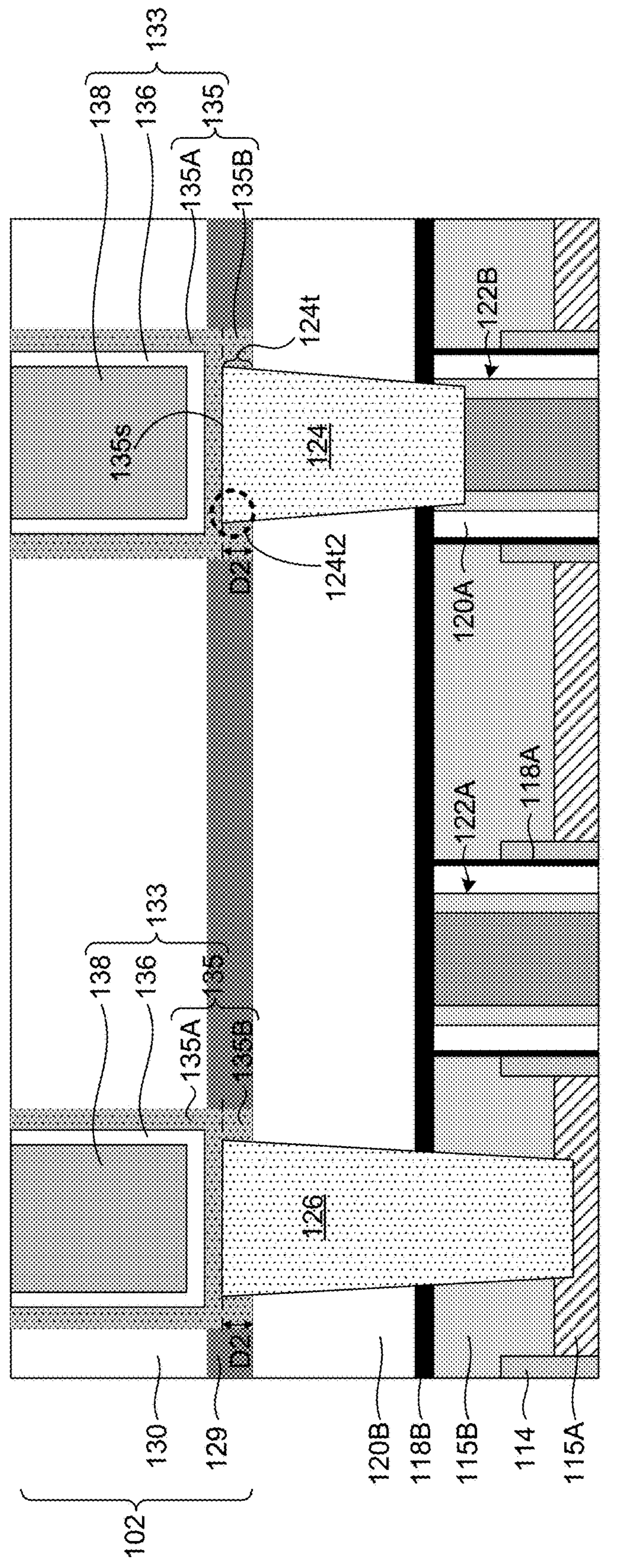

Referring to FIGS. 1B-1E, S/D contact structure 122B can be electrically connected to overlying interconnect structure 102 through via structure 124. A bottom portion of via structure 124 can be disposed in S/D contact structure 122B and can include a conductive material, such as W, Ru, Al. Mo, and Ti. In some embodiments, the conductive material of via structure 124 is formed by a bottom-up approach and formed without a liner (also referred to as "adhesion layer" or "glue layer") along the sidewalls of via structure 124. As a result, via structure 124 can be referred to as "liner-free via structure 124." In some embodiments, via structure 124 can have different top edge cross-sectional profiles, such as a straight edge profile **124*t*1 shown in FIG. 1C, a slanted edge profile 124*t*2 shown in FIG. 1D, and a curved edge cross-sectional profile 124*t*3 shown in FIG. 1E. The top edge cross-sectional profile of via structure 124 can depend on the configuration of the portion of interconnect structure 102 surrounding the top portion of via structure 124, as described in detail below. In some embodiments, via structure 124 with top edge cross-sectional profile 124*t*1 can have a top surface substantially coplanar with a top surface of ILD layer 120B, as shown in FIG. 1C. On the other hand, the top surface of via structure 124 with top edge cross-sectional profiles 124*t*2 or 124*t*3 can be at a higher horizontal surface plane than the top surface of ILD layer 120B, as shown in FIGS. 1D and 1**E.

Figure 1E:
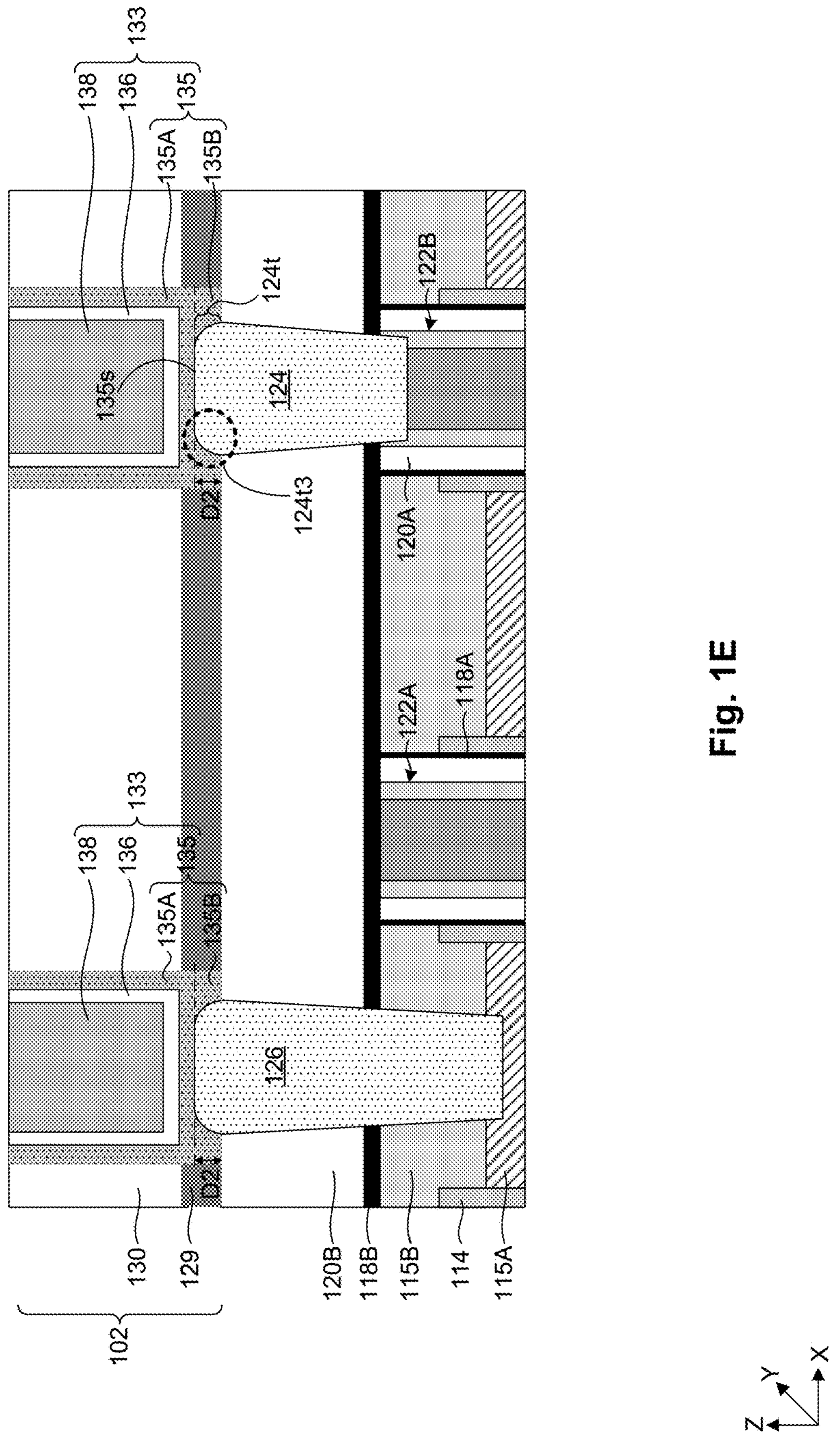
Figure 1F:
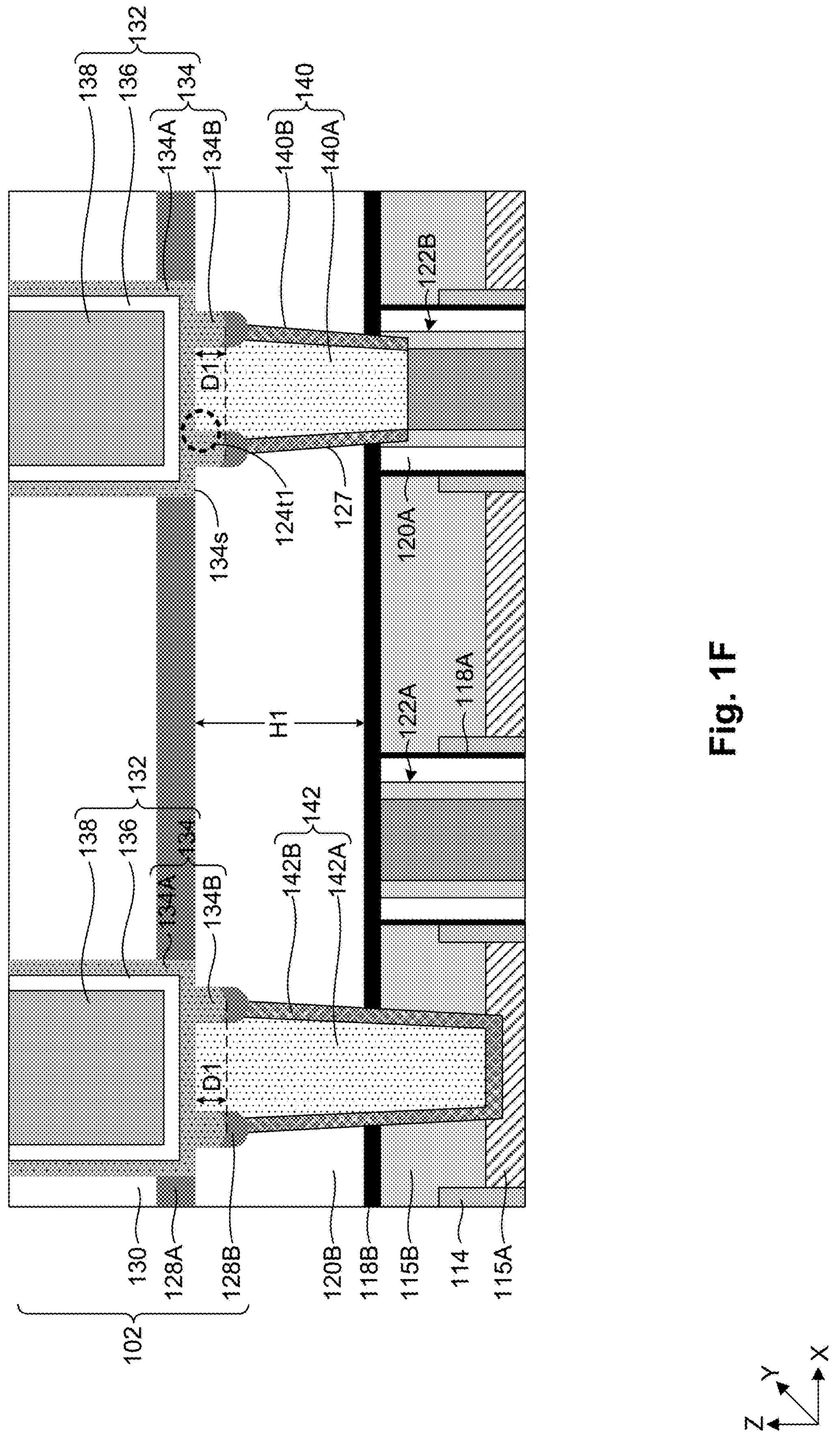
Figure 1G:
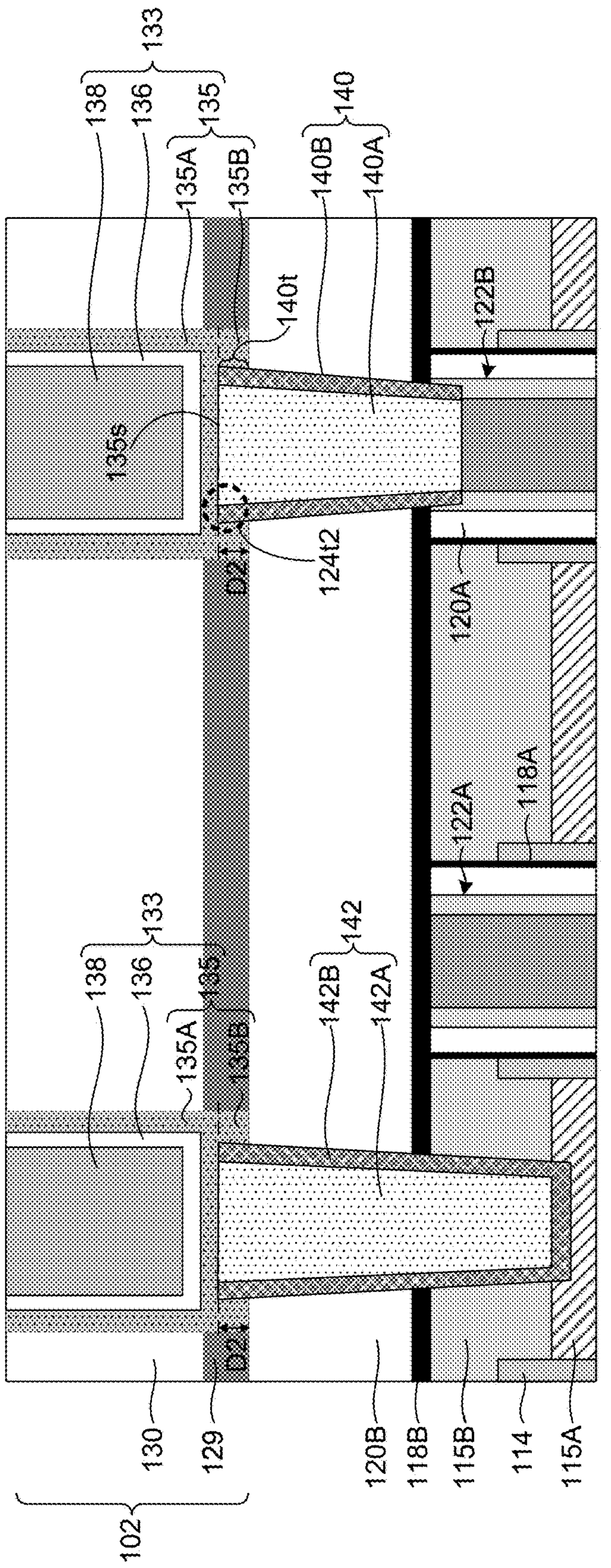
Figure 1H:
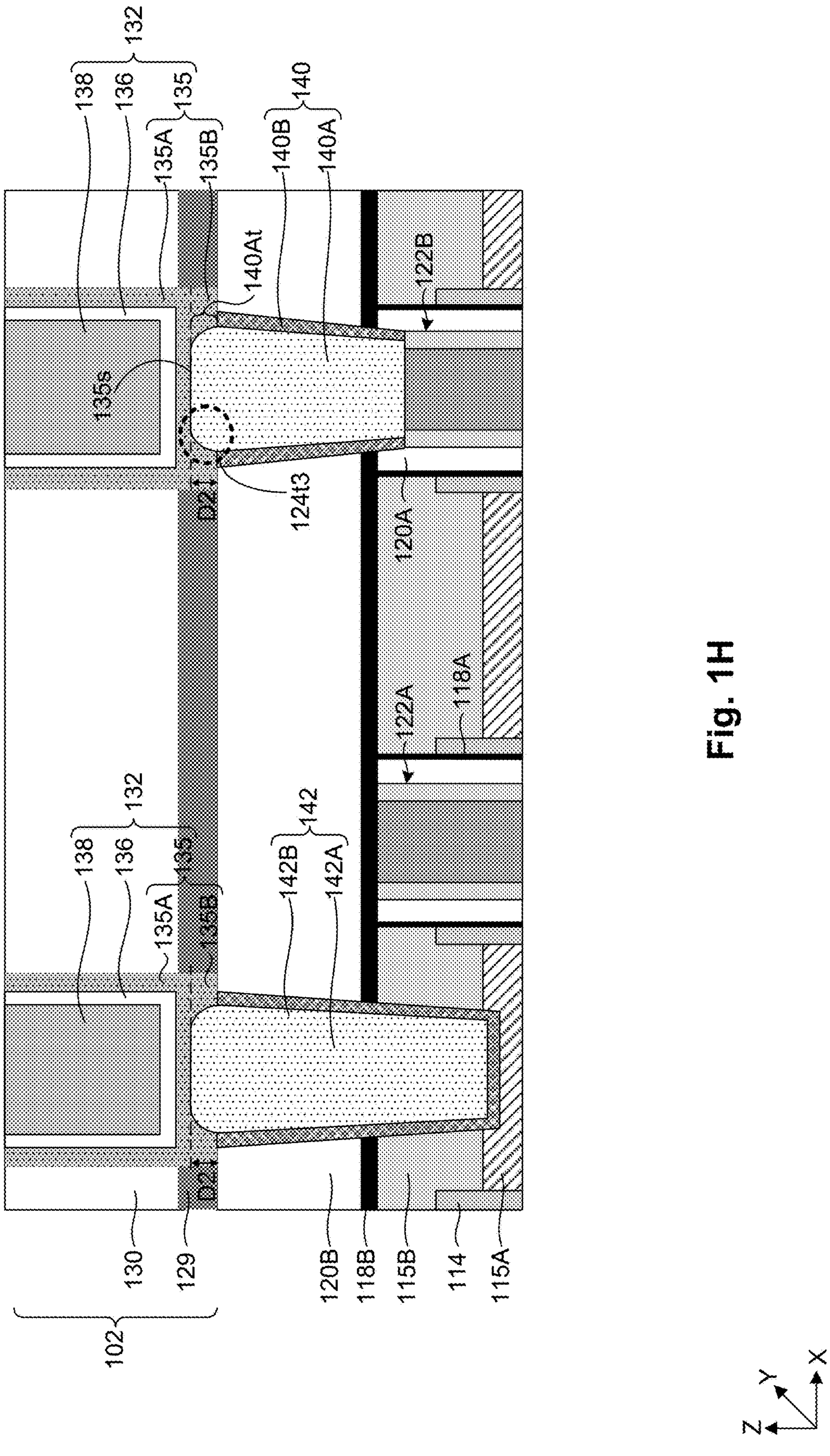

In some embodiments, instead of via structure 124, FET 101 can have a via structure 140 disposed in S/D contact structure 122B, as shown in FIGS. 1F-1H. Via structure 140 can include a via plug 140A and a liner 140B along sidewalls and surrounding via plug 140A for which via structure 140 can also be referred to as "lined via structure 140." The discussion of via structure 124 applies to via plug 140A, unless mentioned otherwise. In some embodiments, liner 140B can include W, Ru, Al, Mo, Ti, TiN, TiSi, CoSi, NiSi, TaN, $TiO_2$, ZnO, or $Al_2O_3$. In some embodiments, liner 140B can have a thickness of about 0.1 nm to about 3 nm. The materials of via plug 140A and liner 140B can be different from each other.

Referring to FIGS. 1B-1E, gate structure 112A can be electrically connected to overlying interconnect structure 102 through gate contact structure 126. Gate contact structure 126 can be disposed in conductive gate cap 115A and can include a conductive material, such as W, Ru, Al. Mo, and Ti. Similar to via structure 124, gate contact structure 126 can be formed without a liner, and as a result can be referred to as "liner-free gate contact structure 126." In some embodiments, gate contact structure 126 can have a height of about 5 nm to about 80 nm. In some embodiments, gate contact structure 126, contact plugs 123C, and via structure 124 can have the same conductive material. In some embodiments, gate contact structure 126, contact plugs 123C, and via structure 124 can have ruthenium. In some embodiments, instead of gate contact structure 126, FET 101 can have a gate contact structure 142 disposed in gate structure 112A, as shown in FIGS. 1F-1H. Gate contact structure 142 can include a contact plug 142A and a liner 142B along sidewalls and surrounding contact plug 142A for which gate contact structure 142 can also be referred to as "lined gate contact structure 142." The discussion of gate contact structure 126 applies to contact plug 142A, unless mentioned otherwise. The discussion of via structure 140, via plug 140A, and liner 140B applies to gate contact structure 142, contact plug 142A and liner 142B, respectively, unless mentioned otherwise.

Referring to FIGS. 1B and 1C, interconnect structure 102 can be disposed on ILD layer 120B, via structure 124, and gate contact structure 126. In some embodiments, interconnect structure 102 can include (i) ESLs 128A and 128B, (ii) an ILD layer 130 disposed on ESL 128A, and (iii) interconnect lines 132. ESL 128A can be disposed directly on ILD layer 120A. ESL 128B can be disposed between top portions of ILD layer 120B and via structure 124 and on an interface 125 between ILD layer 120B and a bottom portion of via structure 124. In some embodiments, ESLs 128A and 128B can include a dielectric material, such as such as LaO, $Al_2O_3$, $Y_2O_3$, TaCN, ZrSi, SiOCN, SiOC, SiCN, ZrN, ZrAlO, $TiO_2$, $Ta_2O_3$, $ZrO_2$, $HfO_2$, SiN, HfSi, AlON, $SiO_2$, SiC, and ZnO. ILD layer 130 can include a low-k dielectric material with a dielectric constant lower than that of $SiO_2$. In some embodiments, the LK or ELK dielectric material can include SiOC, SiCN, or SiOCN.

Interconnect lines 132 can electrically connect FET 101 to power supplies and/or active devices. In some embodiments, each interconnect line 132 can include (i) a barrier structure 134, (ii) a liner 136 disposed on barrier structure 134, and (iii) a conductive plug 138 disposed on liner 136. In some embodiments, barrier structure 134 can include a conductive material, such as W, Ru, Al, Mo, Ti, TiN, TiSi, CoSi, NiSi, and TaN. In some embodiments, liner 136 can function as a seed layer for the formation of conductive plug 138 and can include a conductive material, such as Co, W, Ru, Al, Mo, Ti, TiN, TiSi, CoSi, NiSi, Cu, and TaN. In some embodiments, conductive plug 138 can include a conductive material, such as W, Ru, Al, Mo, Ti, Cu, and Co. The material of barrier structure 134 can be different from the materials of liner 136 and conductive plug 138. In some embodiments, liner 136 can have a thickness of about 0.1 nm to about 3 nm for adequately forming conductive plug 138. In some embodiments, liner 136 may be absent and conductive plug 138 can be disposed directly on barrier structure 134.

Barrier structure 134 can be configured to prevent or minimize diffusion of metal atoms from liner 136 and/or conductive plug 138 to via structure 124 while minimizing the resistance of interconnect line 132. In some embodiments, barrier structure 134 can include (i) an interconnect portion 134A (also referred to as "top portion 134A") and (ii) a contact portion 134B (also referred to as "bottom portion 134B"). Interconnect portion 134A can be in direct contact with and surround the sidewalls and bottom surface of liner 136 (or conductive plug 138 if liner 136 is absent). Furthermore, interconnect portion 134A can be disposed directly on via structure 124. In some embodiments, interconnect portion 134A can have a thickness of about 0.5 nm to about 2 nm to minimize the resistance of interconnect line 132 while preventing or minimizing diffusion of metal atoms from liner 136 and/or conductive plug 138 to via structure 124. Due to the thin profile of interconnect portion 134A, there may be defects in the bottom portion of interconnect portion 134A if formed over a top edge interface (not shown) between top edges of ILD layer 120B and via structure 124. These defects can be susceptible to metal diffusion from liner 136 and/or conductive plug 138 to via structure 124. The formation of such top edge interface under bottom surface 134*s* of interconnect portion 134A can be prevented by contact portion 134B. The presence of contact portion 134B can reduce the trade-off between minimizing the resistance of interconnect line 132 and preventing metal diffusion from liner 136 and/or conductive plug 138 to via structure 124.

Contact portion 134B can be disposed between top portions of ILD layer 120B and via structure 124 to prevent the formation of the top edge interface under bottom surface 134*s* and can be disposed on ESL 128B to prevent the formation of contact portion 134B on interface 125. Furthermore, contact portion 134B can extend a distance D1 along a negative Z-direction from a bottom surface 134*s* of interconnect portion 134A and surround the top portion of via structure 124. In some embodiments, contact portion 134B can have a thickness of about 1 nm to about 2 nm and distance D1 can be about 0.5 nm to about 10 nm or about 10% to about 50% of height H1 of ILD layer 120B. Within these ranges of thickness and distance D1, contact portion 134B along with interconnect portion 134A can adequately prevent or minimize diffusion of metal atoms from liner 136 and/or conductive plug 138 to via structure 124 while minimizing the resistance of interconnect line 132. In some embodiments, an interface between contact portion 134B and via structure 124 can be substantially linear, which can control the top edge profile of via structure 124 to be straight edge profile 124*t*1.

Referring to FIG. 1D, in some embodiments, instead of interconnect lines 132 and ESLs 128A and 128B, interconnect structure 102 can include interconnect lines 133 and ESL 129. The discussion of interconnect structure 102 of FIG. 1C applies to interconnect structure 102 of FIG. 1D, unless mentioned otherwise. In some embodiments, each interconnect line 133 can include (i) a barrier structure 135, (ii) liner 136 disposed on barrier structure 135, and (iii) conductive plug 138 disposed on liner 136. In some embodiments, barrier structure 135 can include a conductive material, such as W, Ru, Al, Mo, Ti, TiN, TiSi, CoSi, NiSi, and TaN. The material of barrier structure 135 can be different from the materials of liner 136 and conductive plug 138.

Similar to barrier structure 134, barrier structure 135 can be configured to prevent or minimize diffusion of metal atoms from liner 136 and/or conductive plug 138 to via structure 124 while minimizing the resistance of interconnect line 133. In some embodiments, barrier structure 135 can include (i) an interconnect portion 135A (also referred to as "top portion 135A") and (ii) a contact portion 135B (also referred to as "bottom portion 135B"). Interconnect portion 135A can be in direct contact with and surround the sidewalls and bottom surface of liner 136 (or conductive plug 138 if liner 136 is absent). Furthermore, interconnect portion 135A can be disposed directly on via structure 124. In some embodiments, interconnect portion 135A can have a thickness of about 0.5 nm to about 2 nm to minimize the resistance of interconnect line 133 while preventing or minimizing diffusion of metal atoms from liner 136 and/or conductive plug 138 to via structure 124.

Similar to contact portion 134B, contact portion 135B can be configured to prevent the formation of the top edge interface under bottom surface 135*s* of interconnect portion 135A. Contact portion 135B can surround top portion 124*t* of via structure 124 and can be disposed on ILD layer 120B to prevent the formation of the top edge interface under bottom surface 135*s*. Furthermore, contact portion 135B can be disposed in ESL 129 and can extend a distance D2 along a negative Z-direction from a bottom surface 135*s* of interconnect portion 135A. In some embodiments, contact portion 134B can have a thickness of about 1 nm to about 2 nm and distance D2 can be less than a thickness of ESL 129. Within these ranges of thickness and distance D2, contact portion 135B along with interconnect portion 135A can adequately prevent or minimize diffusion of metal atoms from liner 136 and/or conductive plug 138 to via structure 124 while minimizing the resistance of interconnect line 135. In some embodiments, due to slanted edge profile 124*t*2 of via structure 124, a slanted interface can be formed between contact portion 135B and via structure 124.

Referring to FIG. 1E, in some embodiments, interconnect lines 133 can be disposed on via structure 124 and gate contact structure 126 with curved edge profiles 124*t*3, instead of slanted edge profiles 124*t*2. The discussion of interconnect structure 102 of FIG. 1D applies to interconnect structure 102 of FIG. 1E, unless mentioned otherwise. In some embodiments, due to curved edge profile 124*t*3 of via structure 124, a curved interface can be formed between contact portion 135B and via structure 124.

Referring to FIG. 1F, in some embodiments, interconnect structure 102 can be disposed on via structure 140 and gate contact structure 126 instead of on via structure 124 and gate contact structure 126. The discussion of interconnect structure 102 of FIG. 1C applies to interconnect structure 102 of FIG. 1F, unless mentioned otherwise. ESL 128B can be disposed between top portions of ILD layer 120B and via plug 140A and can be disposed on liner 140B and on an interface 127 between ILD layer 120B and a bottom portion of via structure 140. Interconnect portion 134A can be disposed directly on via plug 140A. Contact portion 134B can be disposed between top portions of ILD layer 120B and via plug 140A to prevent the formation of the top edge interface under bottom surface 134*s*. Furthermore, contact portion 134B can surround the top portion of via plug 140A. In some embodiments, an interface between contact portion 134B and via plug 140A can be substantially linear, which can control the top edge profile of via plug 140A to be straight edge profile 124*t*1.

Referring to FIG. 1G, instead of interconnect lines 132, interconnect lines 133 can be disposed on via structure 140 and gate contact structure 142. The discussion of interconnect structure 102 of FIG. 1D applies to interconnect structure 102 of FIG. 1G, unless mentioned otherwise. Interconnect portion 135A can be disposed directly on via structure 140. Contact portion 135B can surround top portion 140*t* of via structure 140 and can be disposed on ILD layer 120B. Contact portion 135B can be in direct contact with top edge and sidewall of liner 140B. In some embodiments, due to slanted edge profile 124*t*2 of via structure 140, a slanted interface can be formed between contact portion 135B and via structure 140.

Referring to FIG. 1H, in some embodiments, interconnect lines 133 can be disposed on via structure 140 and gate contact structure 142 with curved edge profiles 124*t*3, instead of slanted edge profiles 124*t*2. The discussion of interconnect structure 102 of FIG. 1G applies to interconnect structure 102 of FIG. 1H, unless mentioned otherwise. Unlike via structure 140 of FIG. 1G, top portion 140At of via plug 140A is not surrounded by liner 140B in via structure 140 of FIG. 1H. As a result, contact portion 135B can be in direct contact with and surround top portion 140At of via plug 140A and can be disposed on top surfaces of liner 140B and ILD layer 120B. In some embodiments, due to curved edge profile 124*t*3 of via plug 140A, a curved interface can be formed between contact portion 135B and via plug 140.

The above discussion of interconnect structure 102 with respect to via structure 124 and via structure 140 applies to gate contact structure 126 and gate contact structure 142, respectively.

Figure 1I:
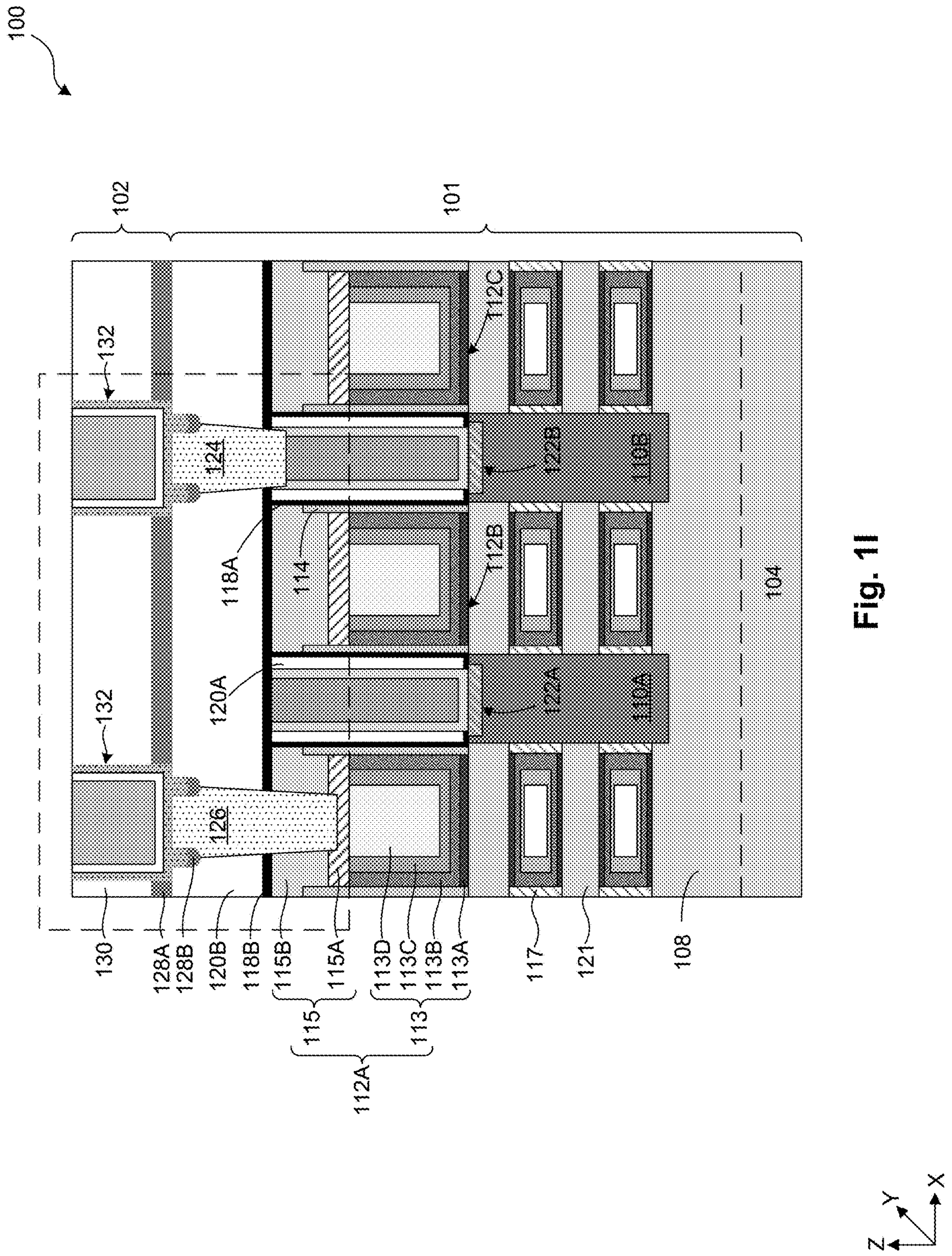

Referring to FIG. 1I, in some embodiments, FET 101 can be a GAA FET 101 instead of finFET 101 shown in FIG. 1B. For GAA FET 101, gate structures 112A-112C can have cross-sectional views as shown in FIG. 1I, instead of the cross-sectional views shown in FIG. 1B. Gate structures 112A-112C of GAA FET 101 can be wrapped around nanostructured channel regions 121. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm are within the scope of the disclosure. In some embodiments, nanostructured channel regions 121 can be in the form of nanosheets, nanowires, nanorods, nanotubes, or other suitable nanostructured shapes.

Nanostructured channel regions 121 can include semiconductor materials similar to or different from substrate 102. In some embodiments, nanostructured channel regions 110 can include Si, SiAs, silicon phosphide (SiP), SiC, SiCP, SiGe, silicon germanium boron (SiGeB), germanium boron (GeB), silicon-germanium-tin-boron (SiGeSnB), a III-V semiconductor compound, or other suitable semiconductor materials. Though rectangular cross-sections of nanostructured channel regions 121 are shown, nanostructured channel regions 121 can have cross-sections of other geometric shapes (e.g., circular, elliptical, triangular, or polygonal). Gate portions of gate structures 112A-112C surrounding nanostructured channel regions 121 can be electrically isolated from adjacent S/D regions 110A-110C by inner spacers 117. Inner spacers 117 can include an insulating material, such as $SiO_x$, SiN, SiCN, SiOCN, and other suitable insulating materials.

Figure 2:
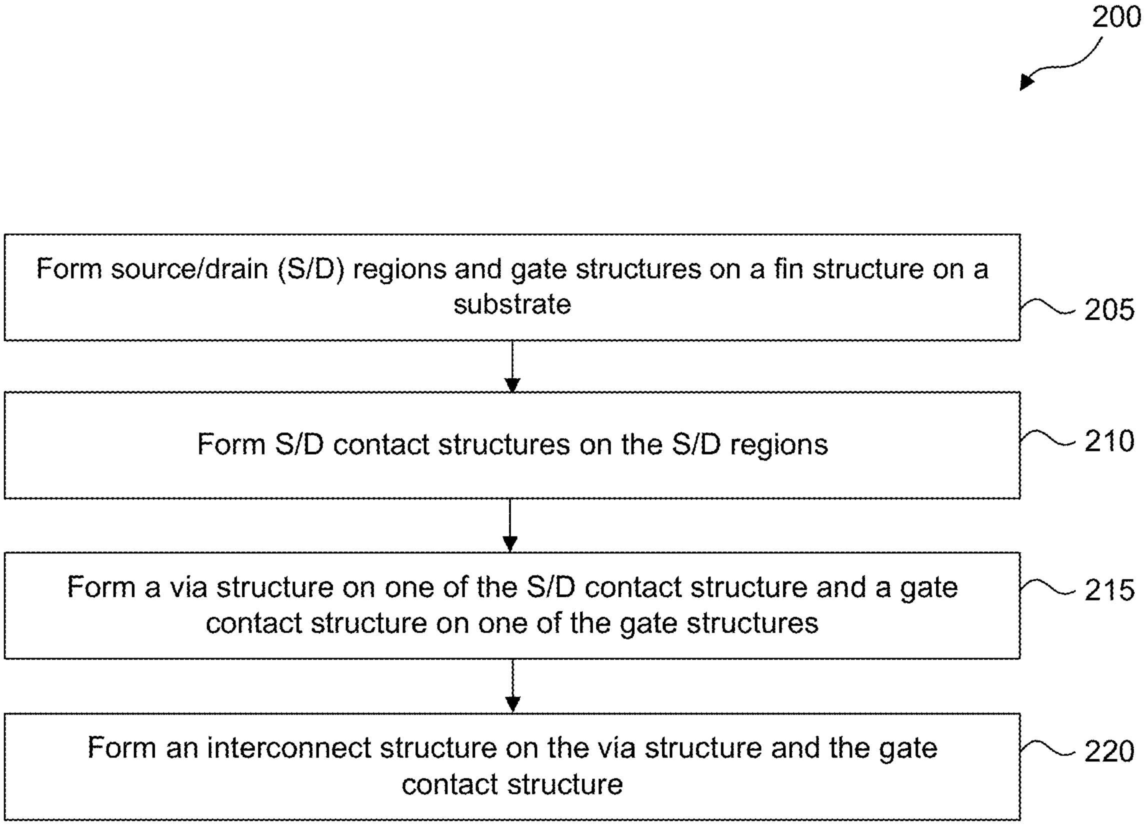
FIG. 2 is a flow diagram of a method for fabricating an IC with conductive structures, in accordance with some embodiments.

FIG. 2 is a flow diagram of an example method 200 for fabricating IC 100 with cross-sectional views of FIG. 1B-1H, according to some embodiments. For illustrative purposes, the operations illustrated in FIG. 2 will be described with reference to the example fabrication process for fabricating IC 100 as illustrated in FIGS. 3-21. FIGS. 3-21 are cross-sectional views of IC 100 along line A-A of FIG. 1A at various stages of fabrication, according to some embodiments. FIGS. 5-21 illustrate enlarged views of region 103 of FIGS. 1B and 4 at various stages of fabrication, according to some embodiments. Operations can be performed in a different order or not performed depending on specific applications. It should be noted that method 200 may not produce a complete IC 100. Accordingly, it is understood that additional processes can be provided before, during, and after method 200, and that some other processes may only be briefly described herein. The discussion of elements in FIGS. 1A-1H and 3-21 with the same annotations applies to each other, unless mentioned otherwise.

Figure 3:
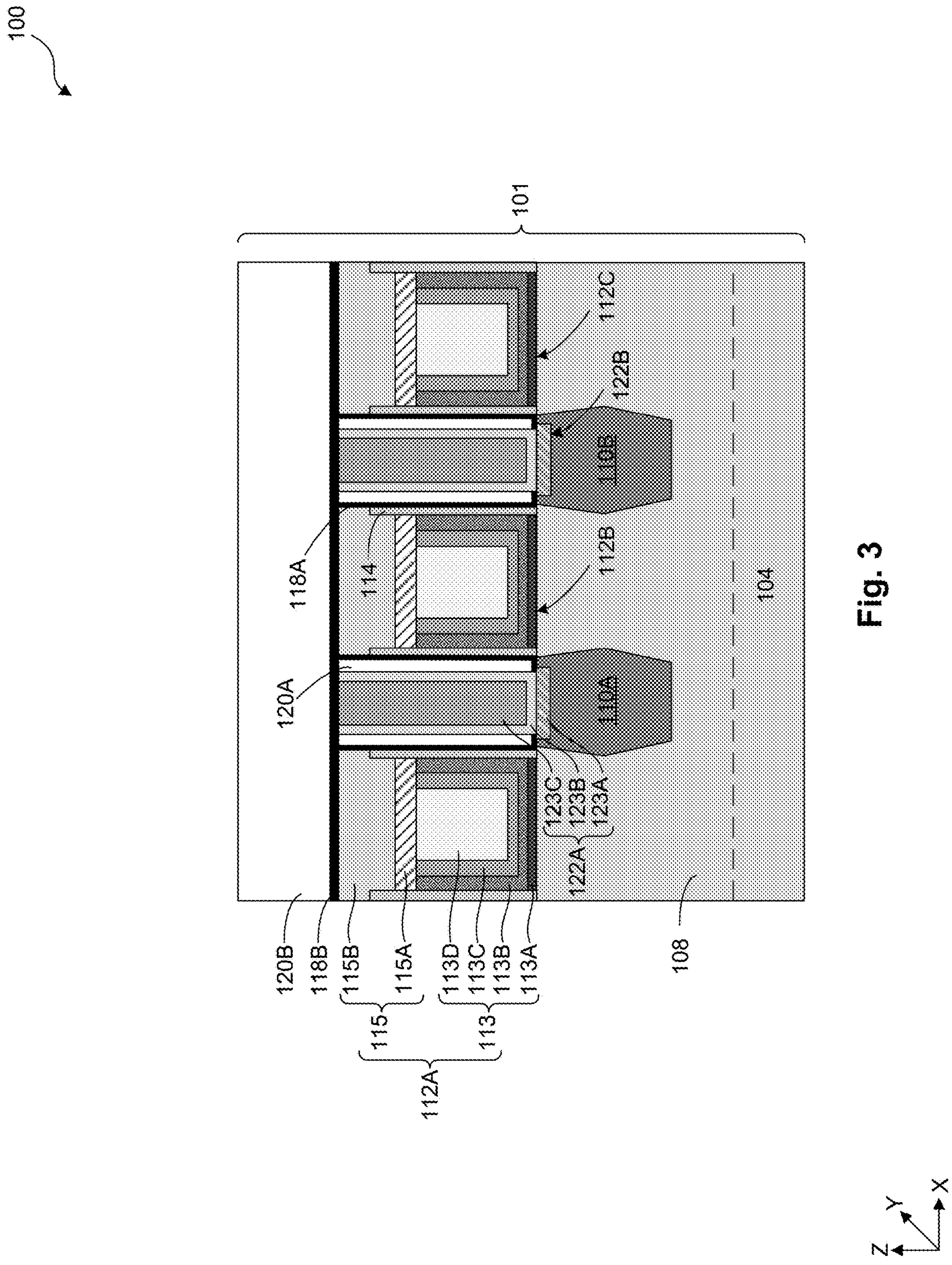

Referring to FIG. 2, in operation 205, S/D regions and gate structures are formed on a fin structure on a substrate. For example, as shown in FIG. 3, S/D regions 110A and 110B and gate structures 112A-112C can be formed on fin structure 108. The formation of S/D regions 110A and 110B can include forming openings (not shown) in fin structure 108 and epitaxially growing semiconductor material in the openings. The formation of S/D regions 110A and 110B can be followed by the formation of gate structures 112A and 112C, which can be followed by the deposition of ESL 118A on S/D regions 110A and 110B and ILD layer 120A on ESL 118A.

Referring to FIG. 2, in operation 210, S/D contact structures are formed on the S/D regions. For example, as shown in FIG. 3, S/D contact structures 122A and 122B are formed on S/D regions 110A and 110B. The formation of S/D contact structures 122A and 122B can include forming openings (not shown) on S/D regions 110A and 110B through ILD layer 120A and ESL 118A and forming S/D contact structures 122A and 122B in the openings.

Figure 4:
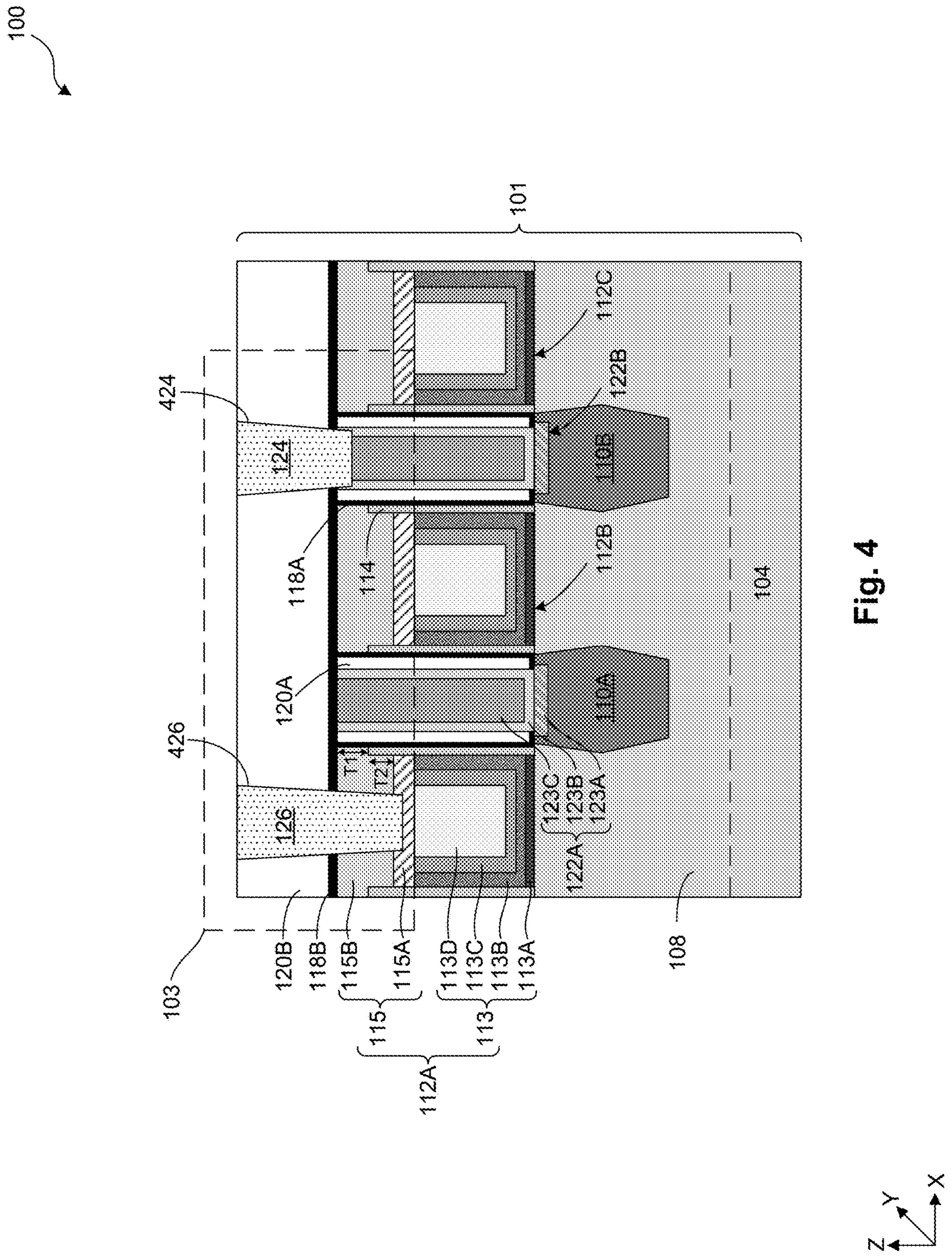
Figure 15:
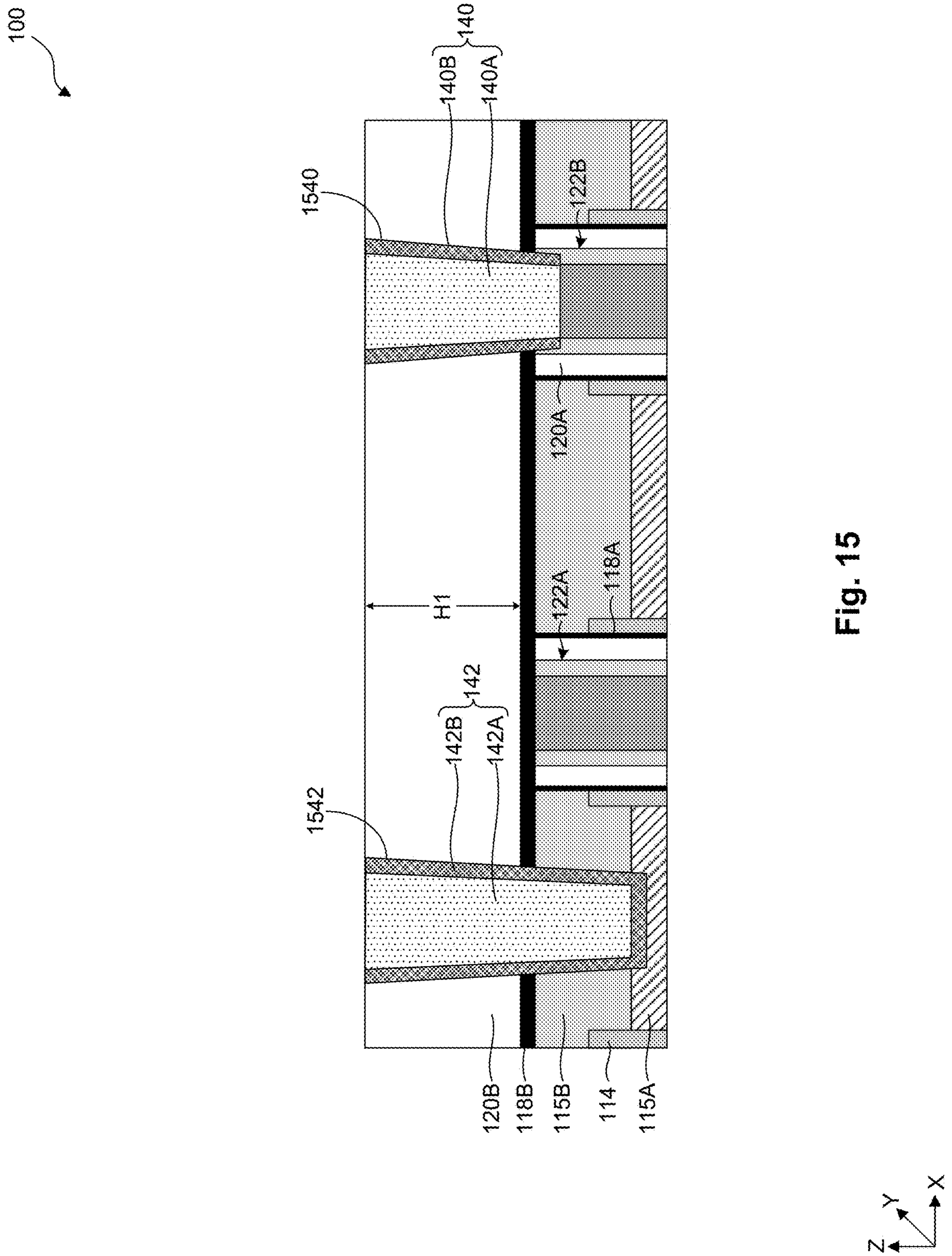

Referring to FIG. 2, in operation 215, a via structure is formed on one of the S/D regions and a gate contact structure is formed on one of the gate structures. For example, as shown in FIG. 4, via structure 124 is formed on S/D region 110B and gate contact structure 126 is formed on gate structure 112A. In some embodiments, via structure 124 and gate contact structure 126 can be formed at the same time with the same conductive material. The formation of via structure 124 and gate contact structure 126 can include (i) depositing ESL 118B on S/D contact structures 122A and 122B and gate structures 112A-112C, as shown in FIG. 4, (ii) depositing ILD layer 120B on ESL 118B, (iii) forming a via opening (not shown) on S/D contact structure 122A and a gate contact opening (not shown) on gate structure 112A through ILD layer 120B and ESL 118B, and (iv) forming via structure 124 in the via opening and gate contact structure 126 in the gate contact opening. In some embodiments, instead of via structure 124 and gate contact structure 126, via structure 140 can be formed in the via opening and gate contact structure 142 can be formed in the gate contact opening, as shown in FIG. 15. The top surfaces of ILD layer 120B, via structure 124 (or via structure 140), and gate contact structure 126 (or gate contact structure 142) can be substantially coplanar with each other.

Referring to FIG. 2, in operation 220, an interconnect structure is formed on the via structure and the gate contact structure.

Figure 5:
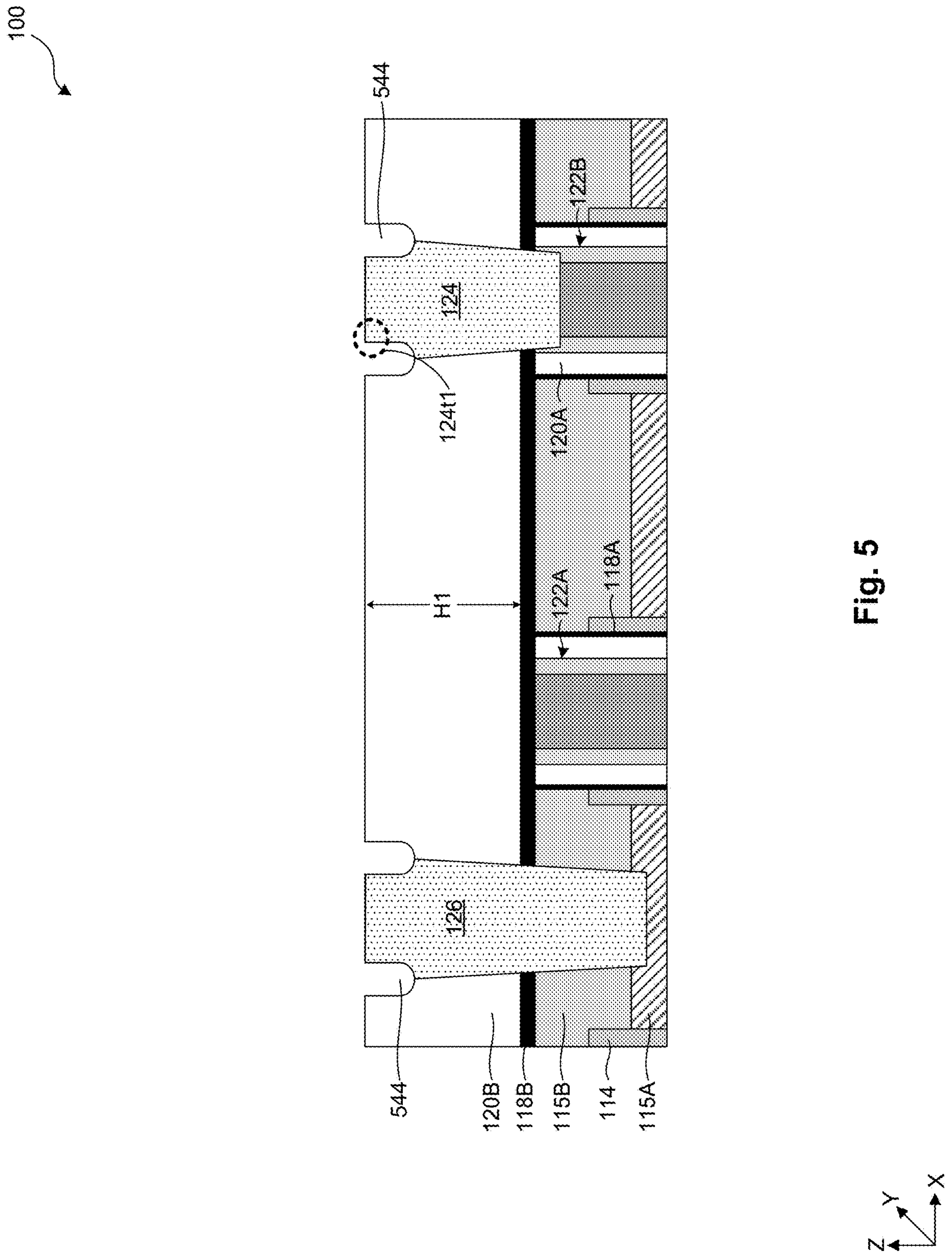
Figure 6:
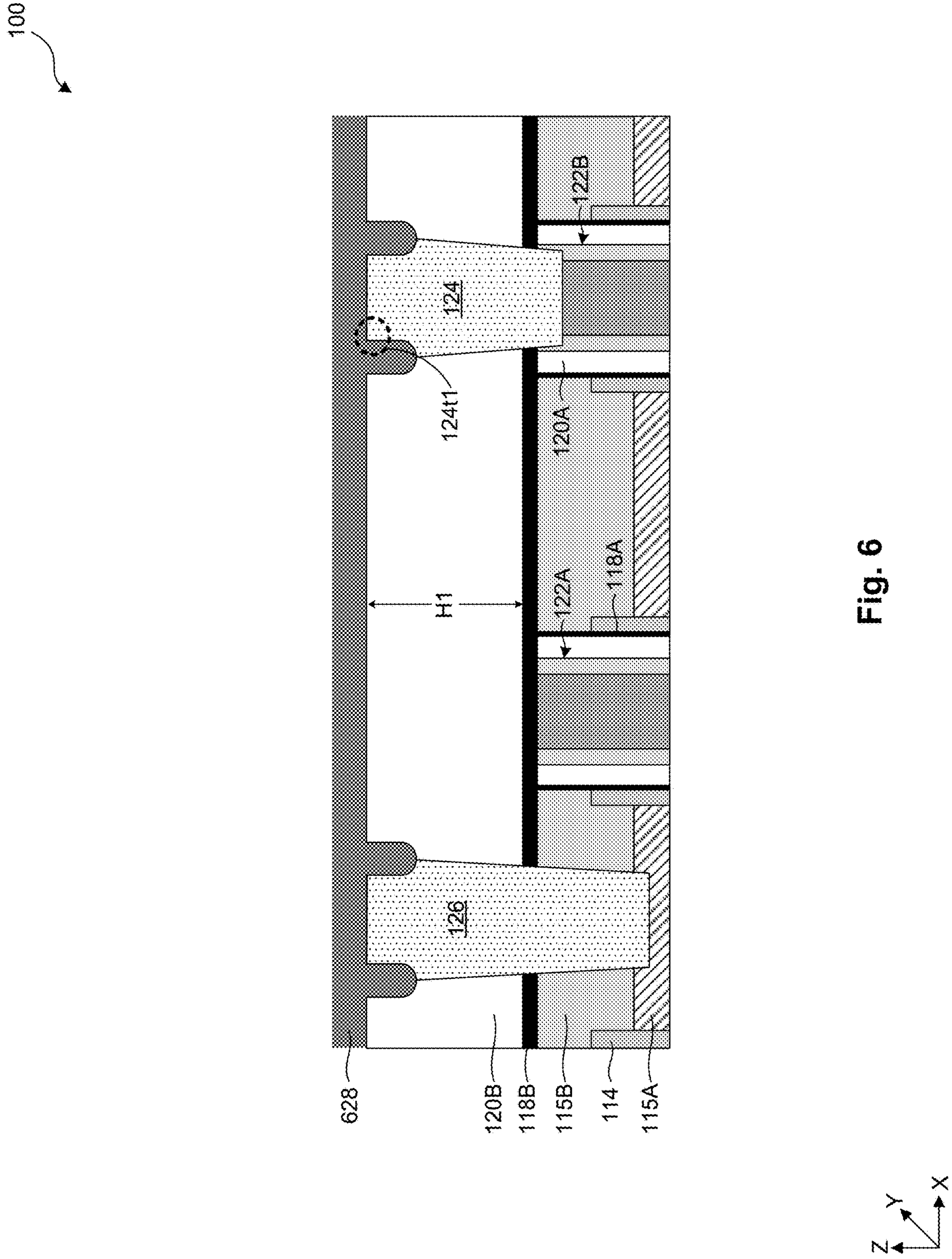
Figure 7:
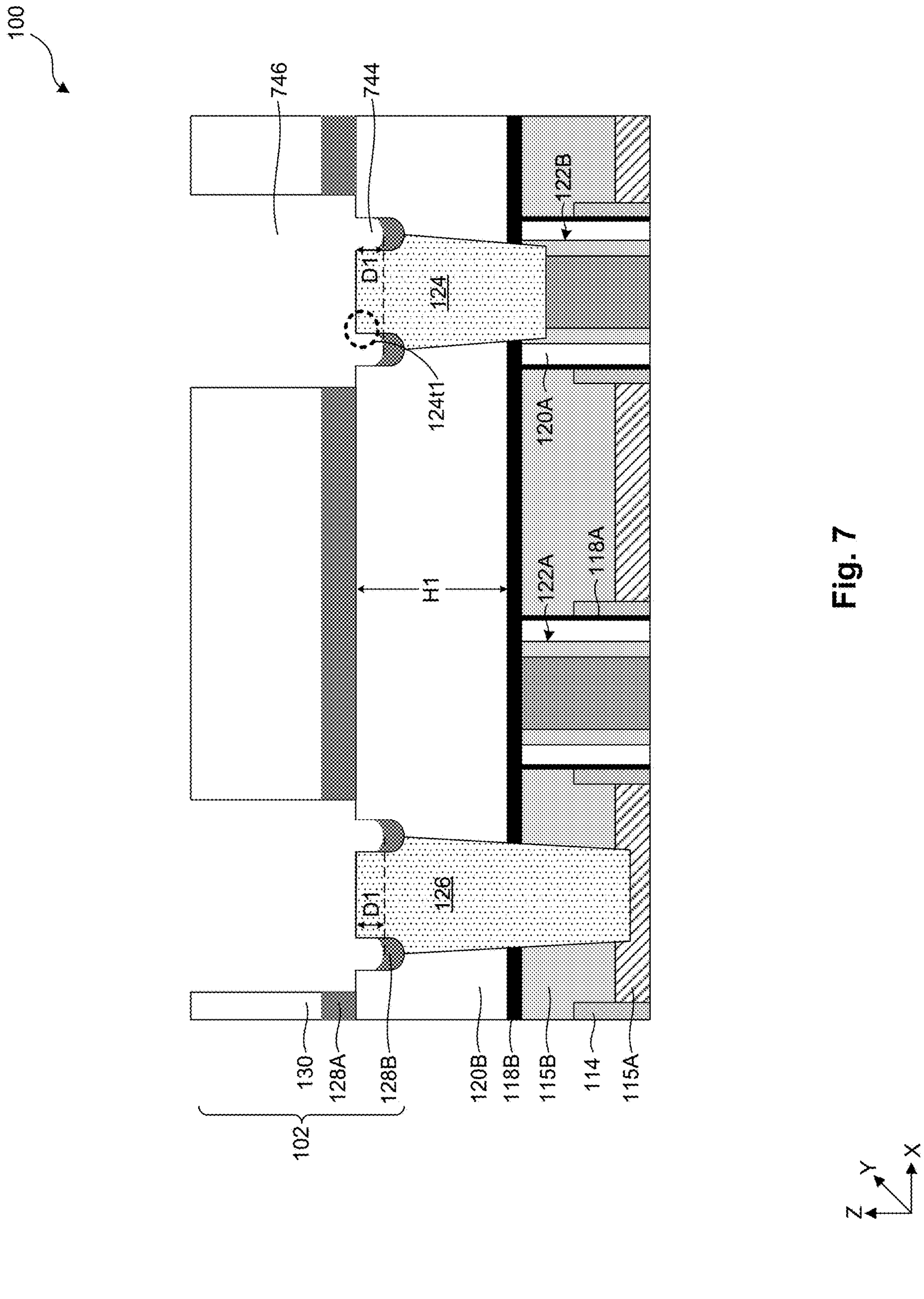
Figure 8:
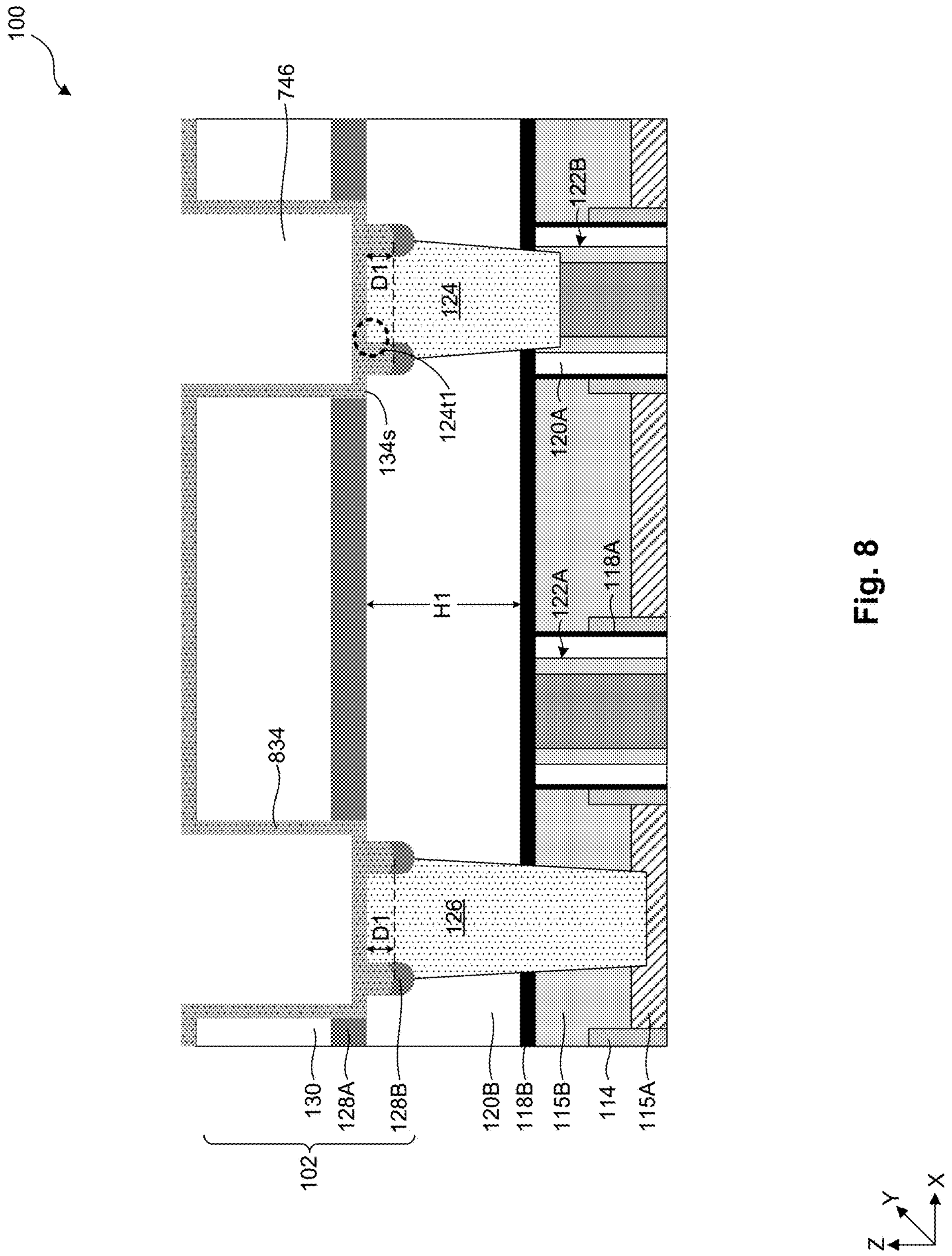
Figure 9:
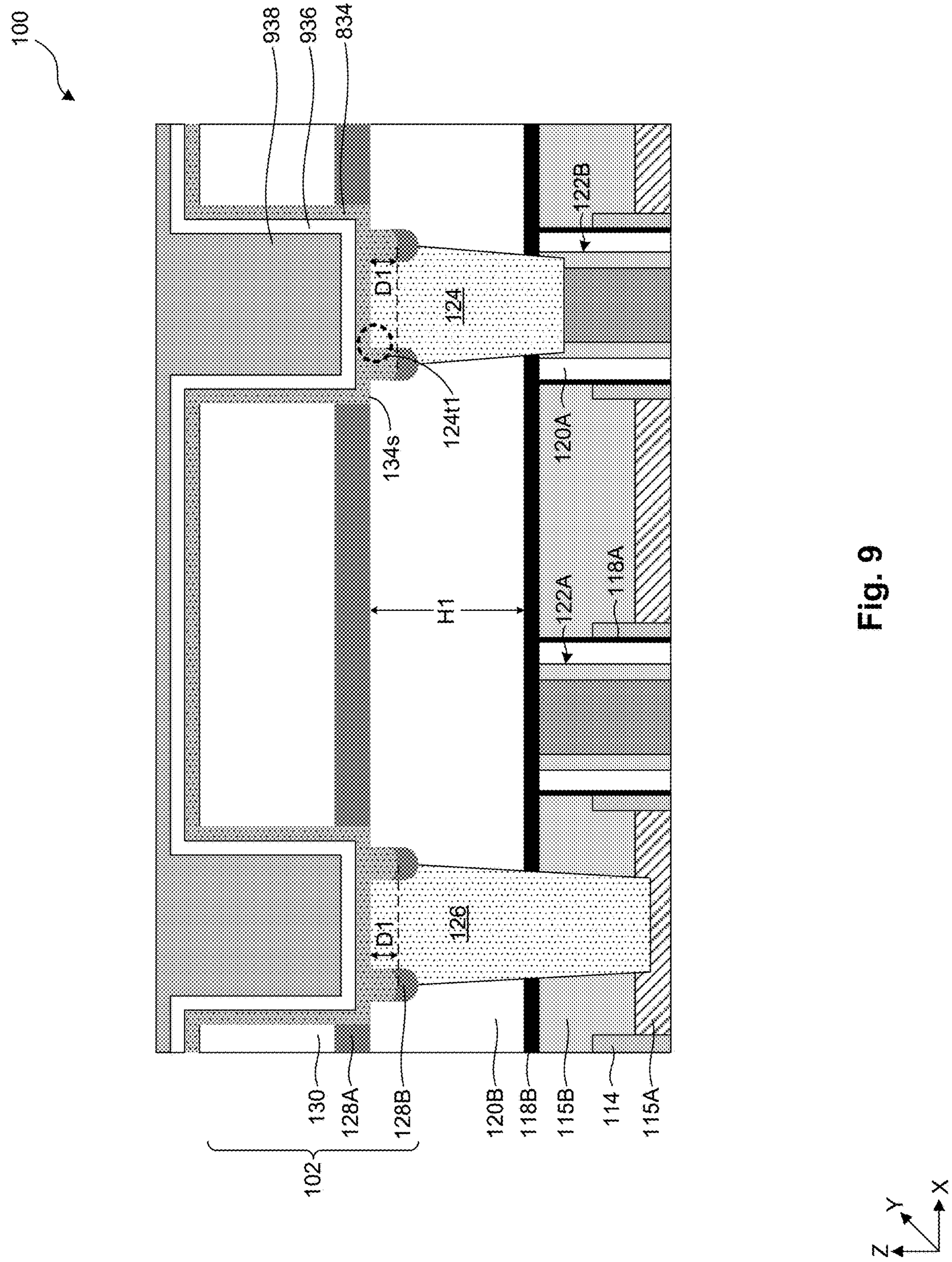
Figure 10:
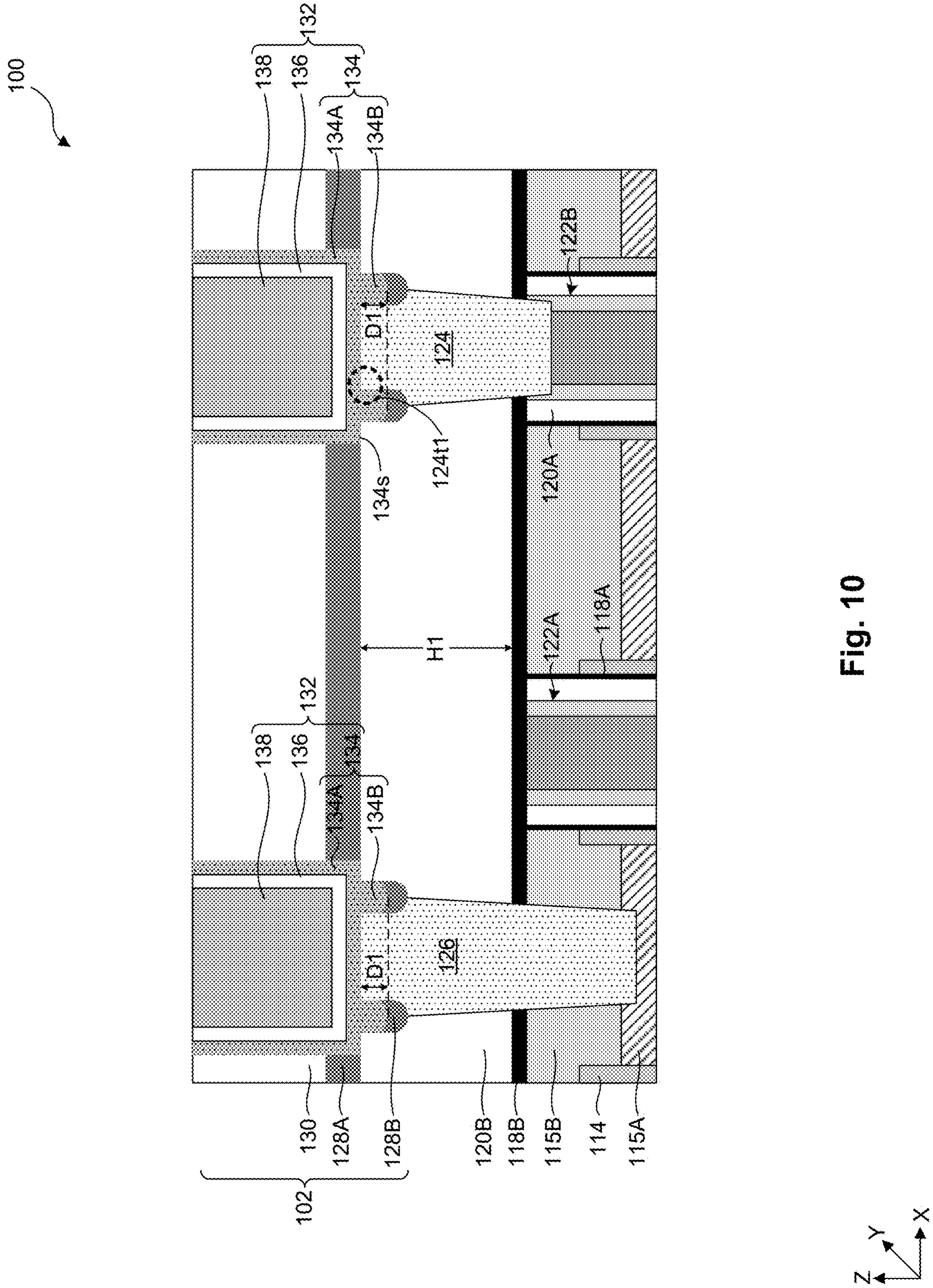

In some embodiments, interconnect structure 102 of FIG. 1C can be formed on via structure 124 and gate contact structure 126, as described with reference to FIGS. 5-10. The formation of interconnect structure 102 of FIG. 1C can include sequential operations of (i) forming trenches 544 surrounding via structure 124 and/or gate contact structure 126 and at top edge interfaces 424 and 426, as shown in FIG. 5, (ii) depositing a layer 628 having the material of ESLs 128A and 128B in trenches 544 and on ILD layer 120B, as shown in FIG. 6, (iii) depositing ILD layer 130 on layer 628, (iv) etching portions of ILD layer 130 and layer 628 on via structure 124 and gate contact structure 126 to form openings 746, as shown in FIG. 7, (v) etching portions of layer 628 surrounding via structure 124 and gate contact structure 126 to form trenches 744, as shown in FIG. 7, (v) depositing a layer 834 having the material of barrier structure 134 in openings 746 and trenches 744, as shown in FIG. 8, (vi) depositing a layer 936 having the material of liner 136 on layer 834, as shown in FIG. 9, (vii) depositing a layer 938 having the material of conductive plug 138 on layer 936, as shown in FIG. 9, and (viii) performing a chemical mechanical polishing (CMP) process on the structure of FIG. 9 to form the structure of FIG. 10 with top surfaces of ILD layer 130, barrier structures 134, liners 136, and conductive plugs 138 substantially coplanar with each other. In some embodiments, trenches 544 can be formed in via structure 124 or gate contact structure 126, instead of forming in both via structure 124 and gate contact structure 126.

Figure 11:
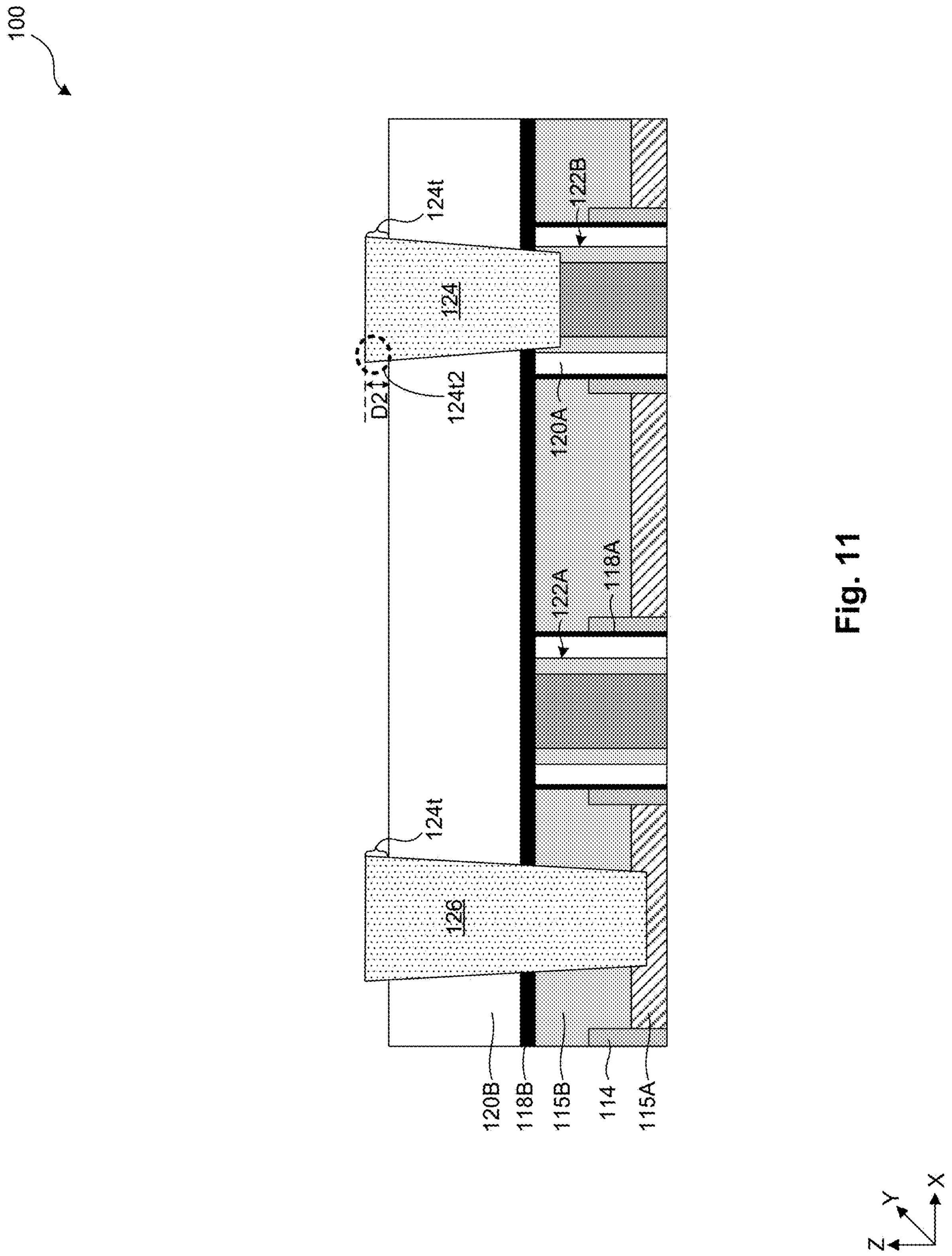
Figure 12:
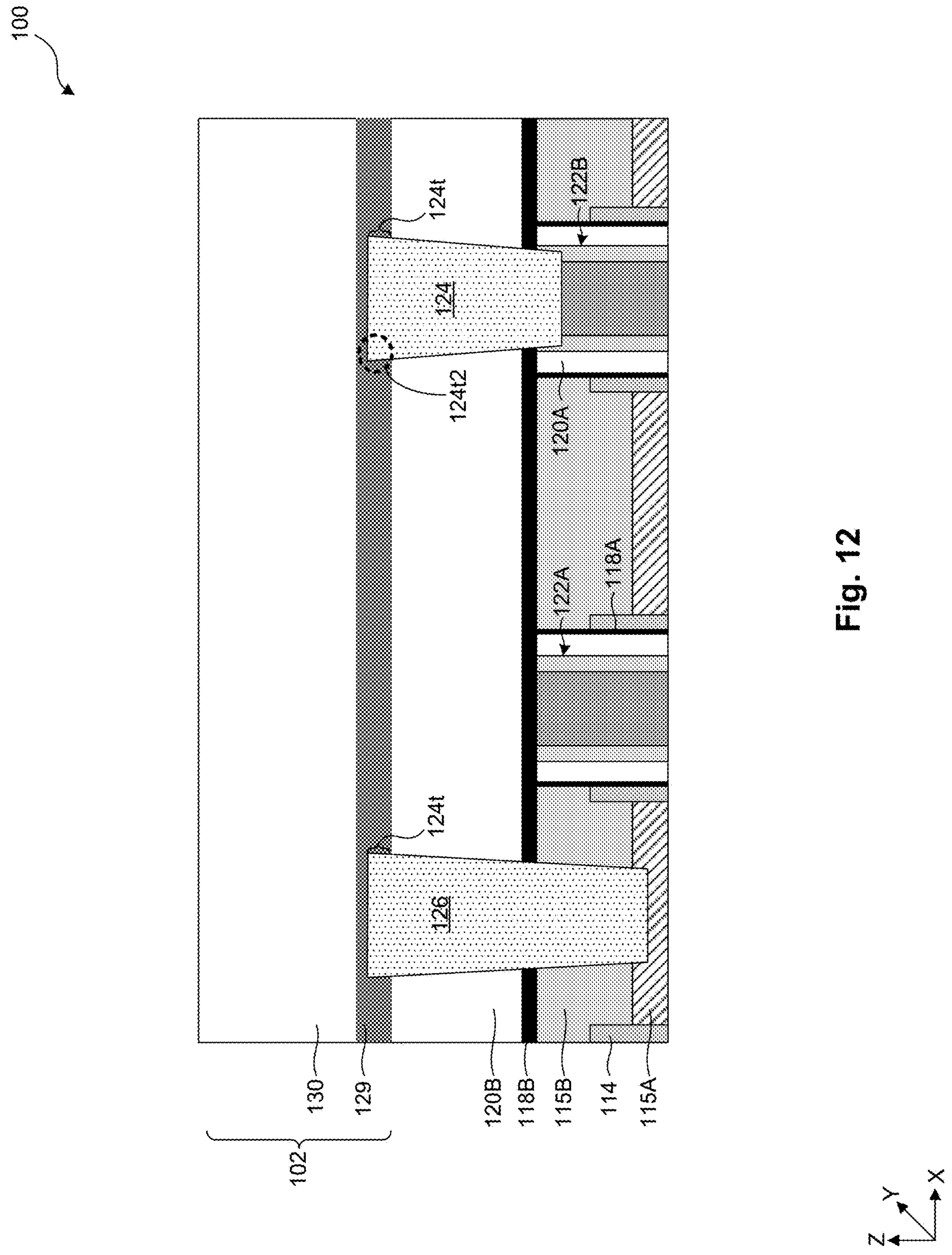
Figure 13:
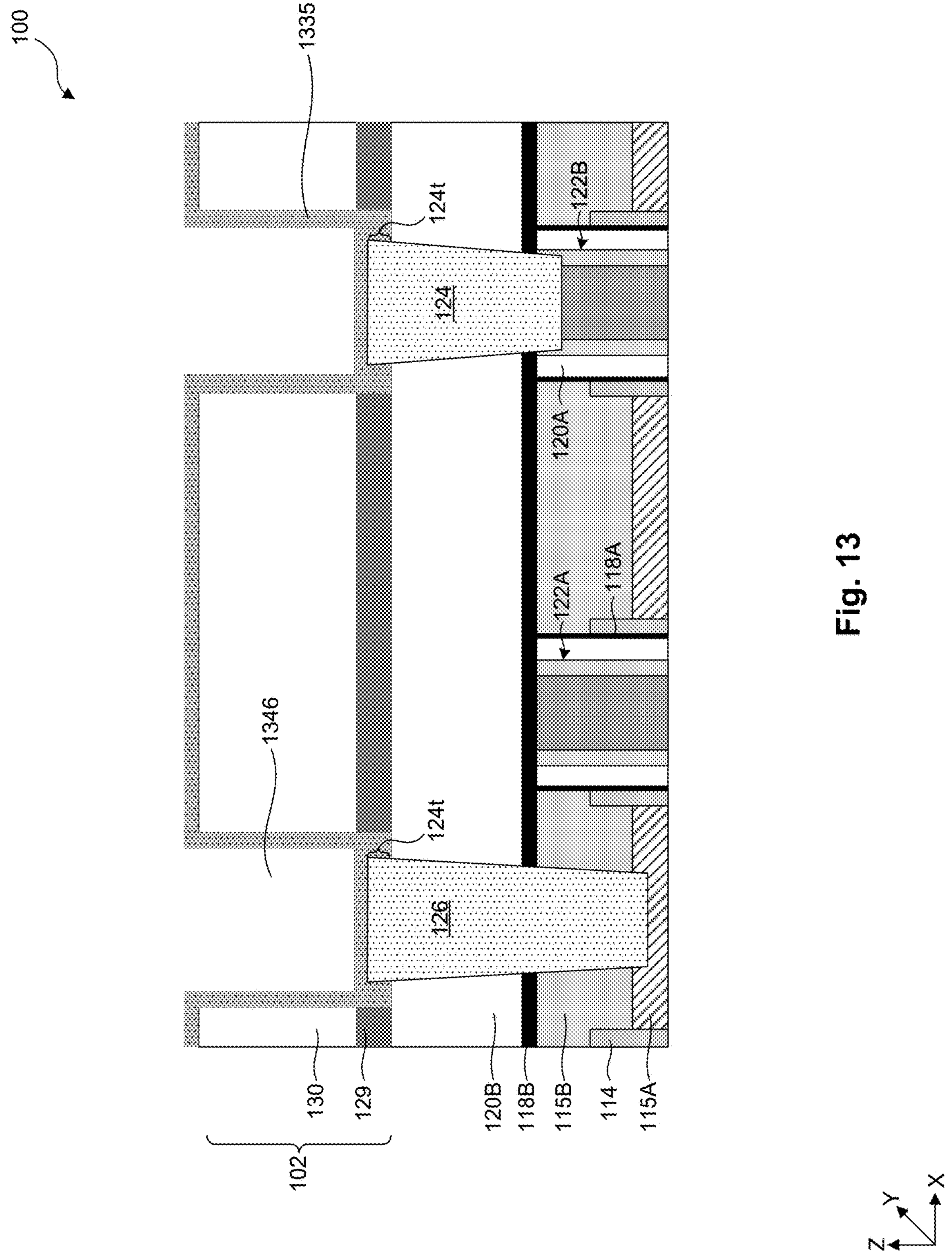
Figure 14:
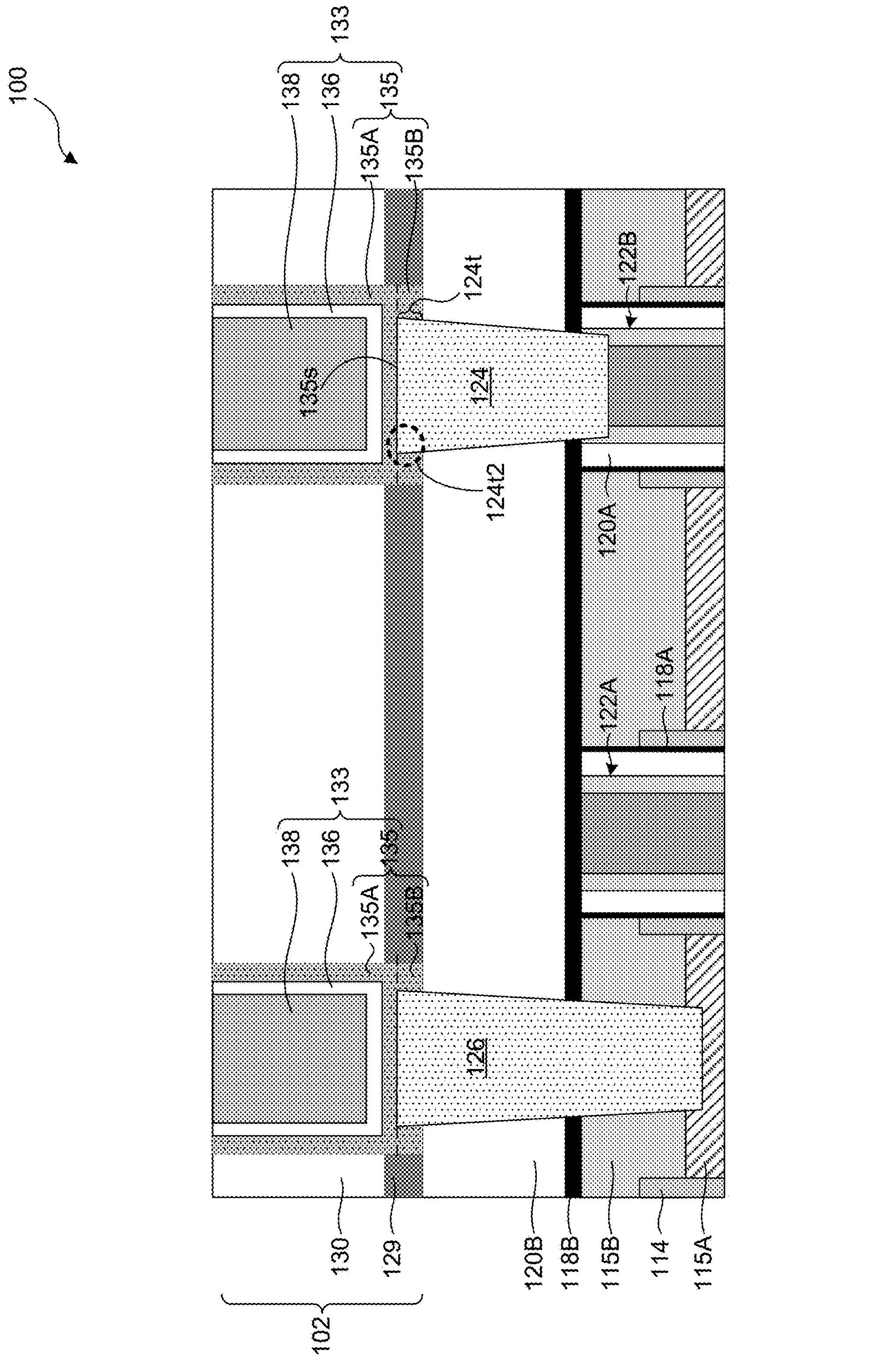

In some embodiments, interconnect structure 102 of FIG. 1D can be formed on via structure 124 and gate contact structure 126, as described with reference to FIGS. 11-14. The formation of interconnect structure 102 of FIG. 1D can include sequential operations of (i) performing an etching process on the structure of FIG. 4 to remove ILD layer 120B and expose top portions 124*t* of via structure 124 and gate contact structure 126, as shown in FIG. 11, (ii) depositing ESL 129 on the structure of FIG. 11 to cover top portions 124*t*, as shown in FIG. 12, (iii) depositing ILD layer 130 on ESL 129, as shown in FIG. 12, (iv) etching portions of ILD layer 130 on via structure 124 and gate contact structure 126 to form openings 1346, as shown in FIG. 13, (v) etching portions (not shown) of ESL 129 on and surrounding via structure 124 and gate contact structure 126 to expose top portions 124*t*, (vi) depositing a layer 1335 having the material of barrier structure 135 in openings 1346 and to cover top portions 124*t*, as shown in FIG. 13, (vii) similar to operation (vi) described above with reference to FIG. 9, depositing layer 936 having the material of liner 136 on layer 1335, (viii) similar to operation (vii) described above with reference to FIG. 9, depositing layer 938 having the material of conductive plug 138 on layer 936, and (ix) performing a CMP process on layer 1335, layer 936, and layer 938 to form the structure of FIG. 14 with top surfaces of ILD layer 130, barrier structures 135, liners 136, and conductive plugs 138 substantially coplanar with each other.

In some embodiments, interconnect structure 102 of FIG. 1E can be formed by using the above-discussed process of forming interconnect structure 102 of FIG. 1D, except a CMP process can be performed on the structure of FIG. 4 to remove ILD layer 120B and expose top portions 124*t* instead of performing the etching process in operation (i) described above with reference to FIG. 11. In some embodiments, performing the CMP process on the structure of FIG. 4 can result in the curved edge profiles 124*t*3 shown in FIG. 1E. In some embodiments, performing the CMP process can include using a slurry with a composition of (i) an abrasive material of $TiO_2$, $SiO_2$, cerium oxide ($CeO_2$), $ZrO_2$, and/or $Al_2O_3$, (ii) an oxidizer, such as hydrogen peroxide ($H_2O_2$), periodic acid ($H_5IO_6$), and ferric nitrite ($FeNO_3$), (iii) a chelating agent, such as ammonia ($NH_3$), ethylenediaminetetraacetic acid (EDTA), and amines, (iv) a pH adjuster, such as potassium hydroxide (KOH), citric acid ($C_6H_8O_7$), acetic acid, organic acid, and ammonium hydroxide ($NH_4O_H$), and (v) a surfactant, such as organic acid, alcohol, EDTA, and acetic acid. In some embodiments, the concentration of abrasive material in the slurry composition can be less than about 6% and the concentration of other chemicals in the slurry composition can be less than about 3%. In some embodiments, the slurry composition can have a pH value of about 4 to about 12.

Figure 16:
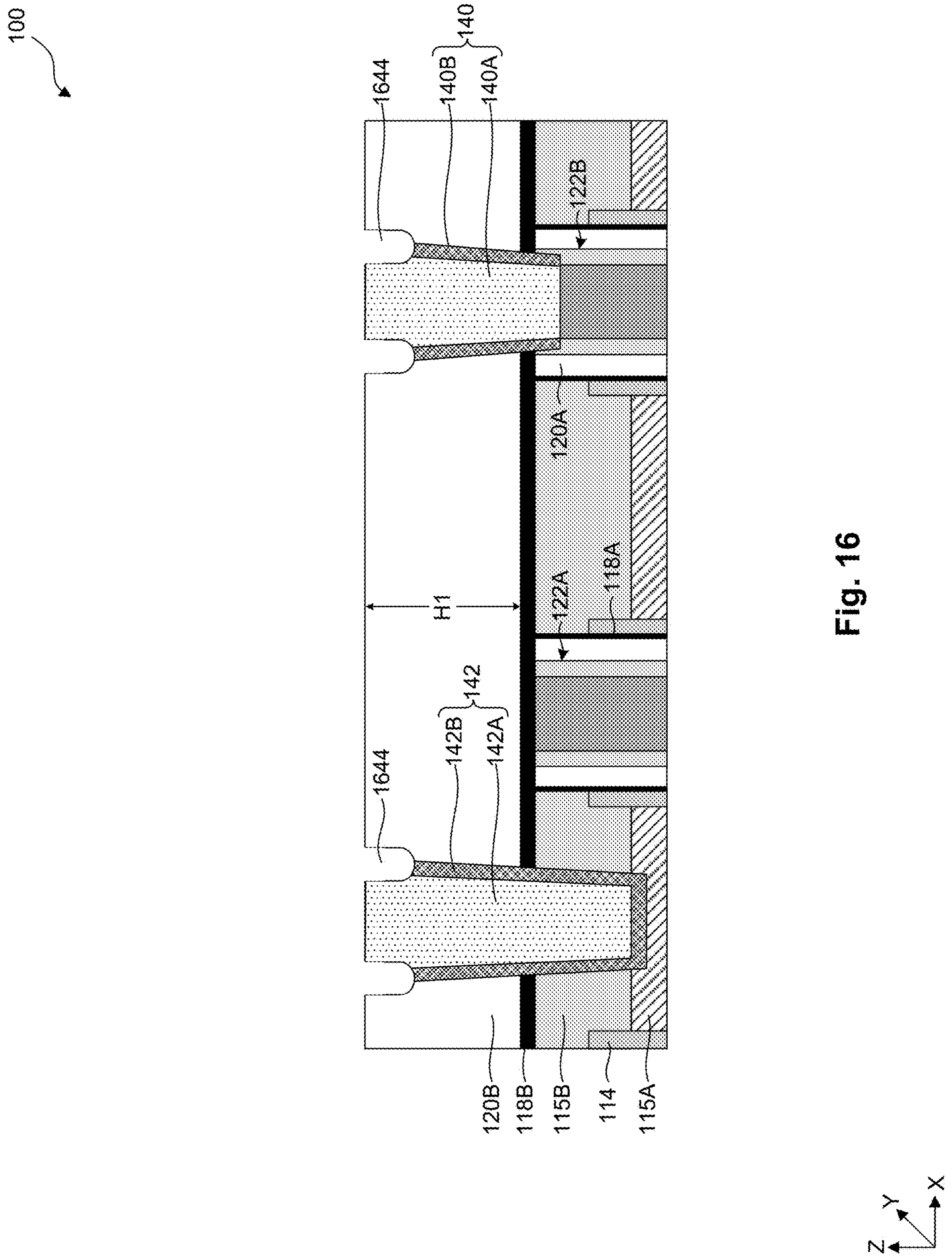
Figure 17:
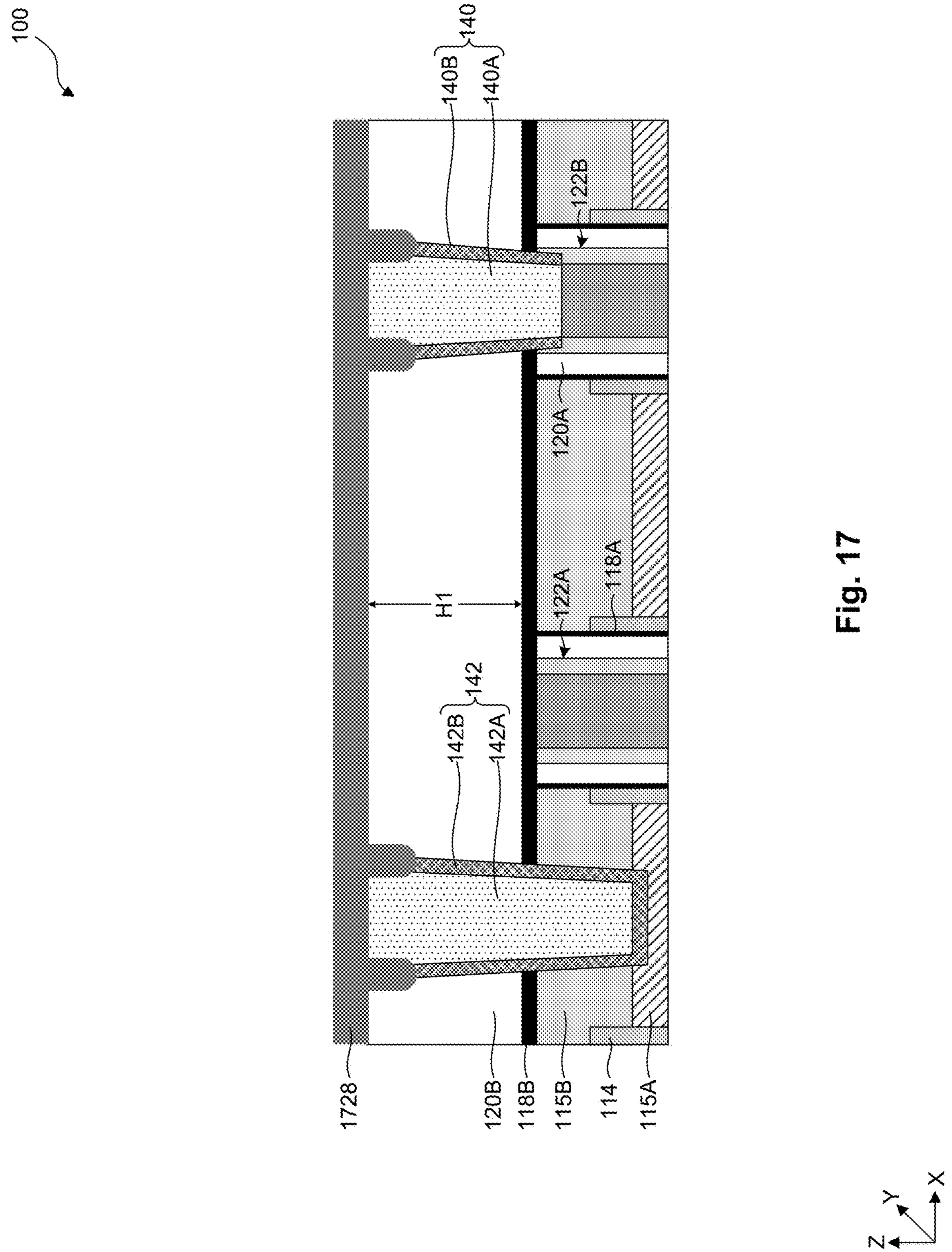
Figure 18:
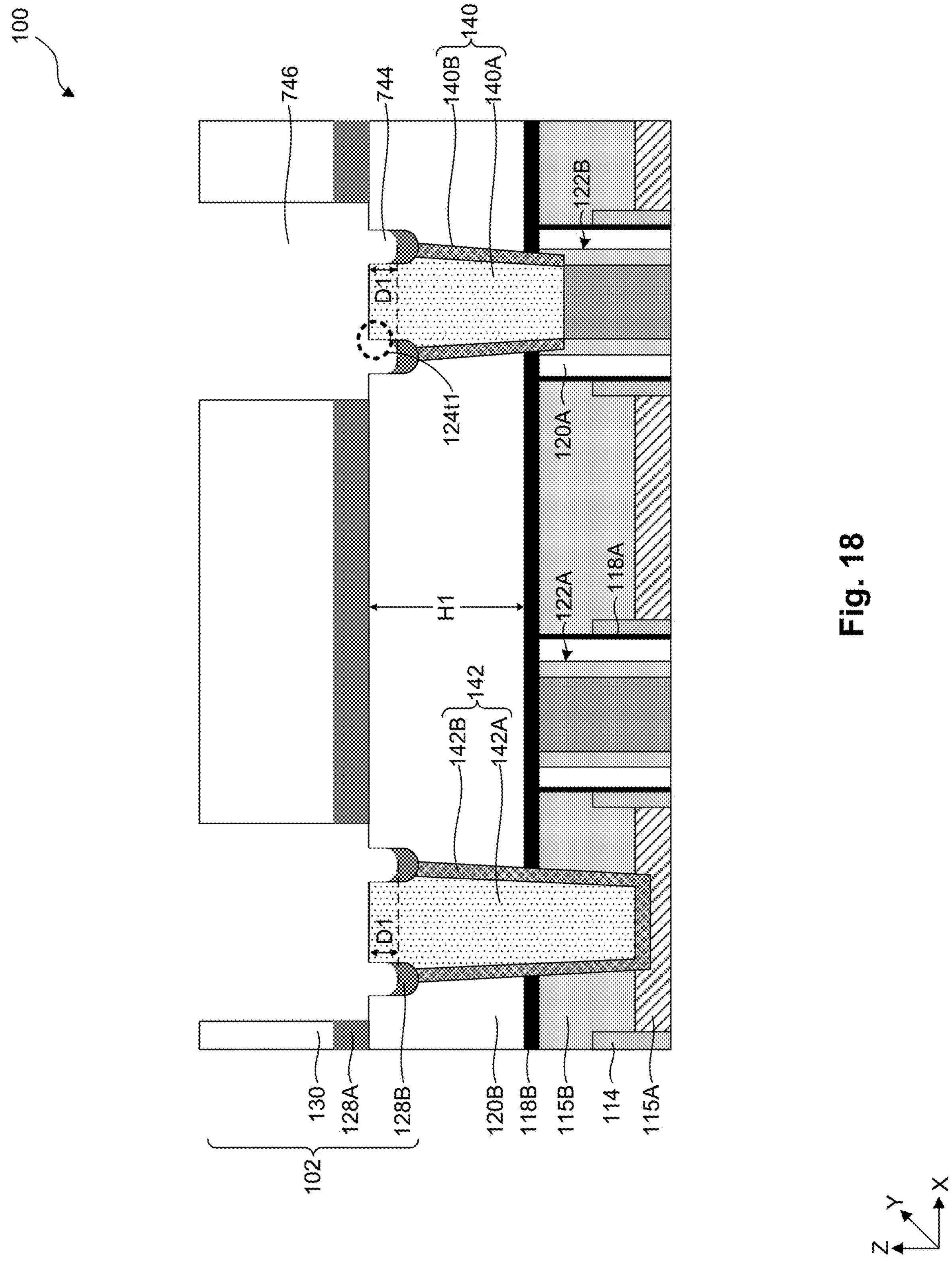
Figure 19:
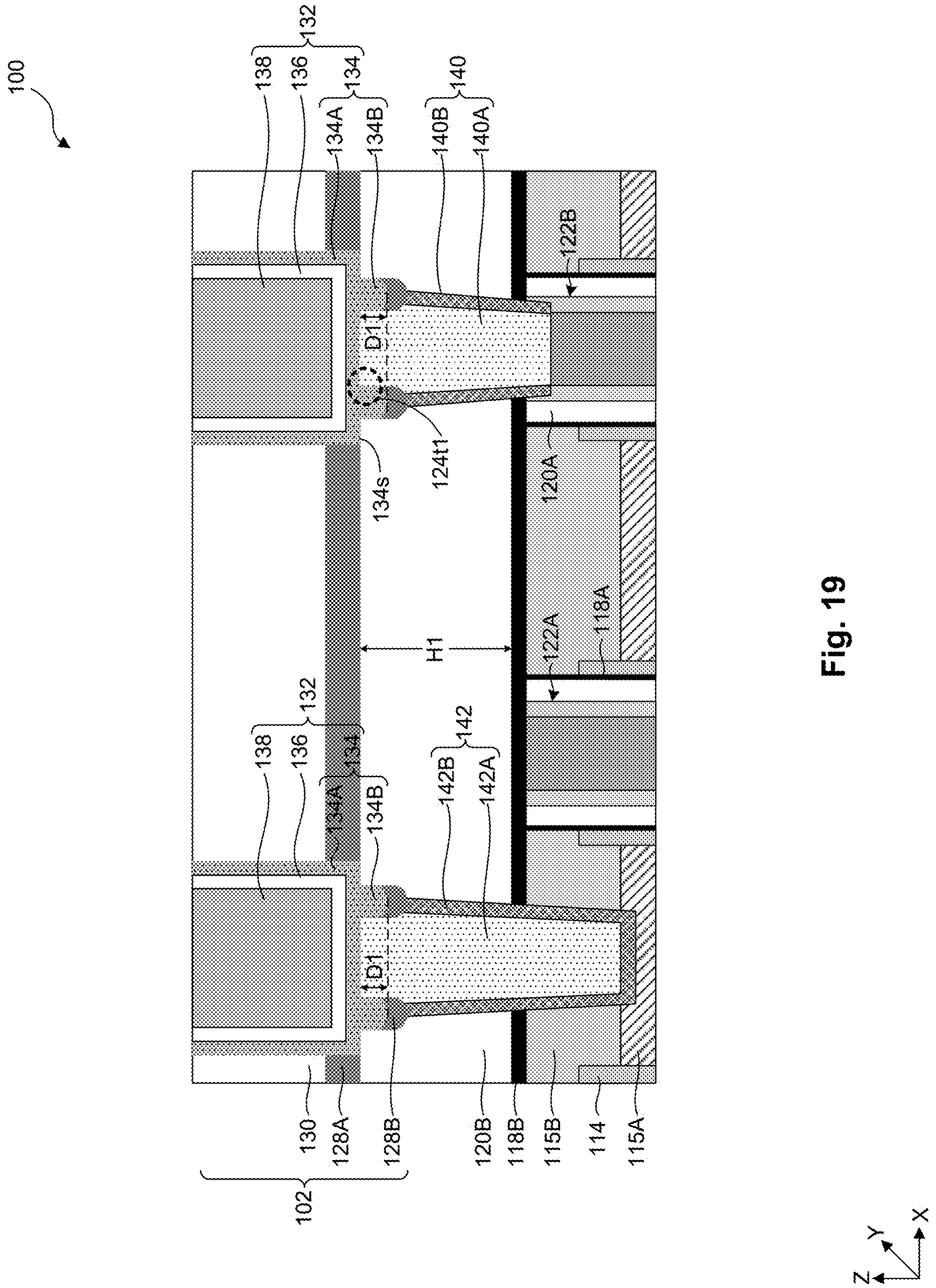

In some embodiments, interconnect structure 102 of FIG. 1F can be formed on via structure 140 and gate contact structure 142, as described with reference to FIGS. 15-19. The formation of interconnect structure 102 of FIG. 1F can include sequential operations of (i) forming trenches 1644 surrounding via structure 140 and gate contact structure 142 and at top edge interfaces 1540 and 1452 (shown in FIG. 15), as shown in FIG. 16, (ii) depositing a layer 1728 having the material of ESLs 128A and 128B in trenches 1644 and on ILD layer 120B, as shown in FIG. 17, (iii) depositing ILD layer 130 on layer 1728, (iv) etching portions of ILD layer 130 and layer 1728 on via structure 140 and gate contact structure 142 to form openings 746, as shown in FIG. 18, (v) etching portions of layer 1728 surrounding via structure 140 and gate contact structure 142 to form trenches 744, as shown in FIG. 18, (v) similar to operation (v) described above with reference to FIG. 8, depositing layer 834 having the material of barrier structure 134 in openings 746 and trenches 744, (vi) similar to operation (vi) described above with reference to FIG. 9, depositing layer 936 having the material of liner 136 on layer 834, (vii) similar to operation (vii) described above with reference to FIG. 9, depositing layer 938 having the material of conductive plug 138 on layer 936, and (viii) performing a CMP process on layer 834, layer 936, and layer 938 to form the structure of FIG. 19 with top surfaces of ILD layer 130, barrier structures 134, liners 136, and conductive plugs 138 substantially coplanar with each other.

Figure 20:
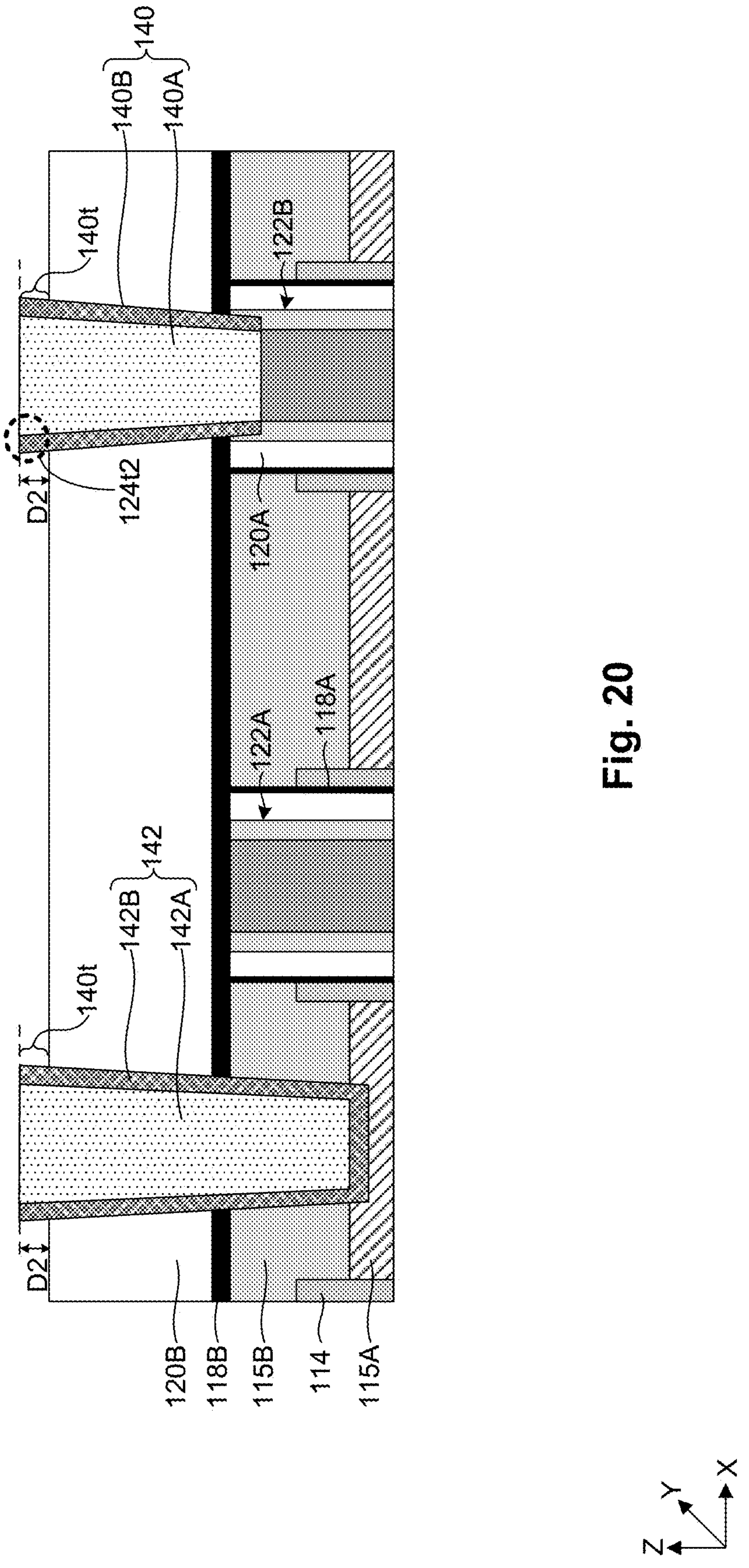

In some embodiments, the formation of interconnect structure 102 of FIG. 1G can include (i) performing an etching process on the structure of FIG. 15 to remove ILD layer 120B and expose top portions 140*t*, as shown in FIG. 20, and (ii) performing operations (ii)-(ix) of the above-discussed process of forming interconnect structure 102 of FIG. 1D on the structure of FIG. 20.

In some embodiments, the formation of interconnect structure 102 of FIG. 1H can include (i) performing a CMP process on the structure of FIG. 15 to remove ILD layer 120B and expose top portions 140*t*, as shown in FIG. 21, and (ii) performing operations (ii)-(ix) of the above-discussed process of forming interconnect structure 102 of FIG. 1D on the structure of FIG. 21.

The present disclosure provides example ICs (e.g., IC 100) with barrier structures (e.g., barrier structures 134 and 135) in interconnect lines (e.g., interconnect lines 132 and 133) to reduce resistance of interconnect lines and to minimize or prevent metal diffusion from liners (e.g., liners 136) and/or plugs (e.g., conductive plugs 138) in interconnect lines to underlying contact structures (e.g., gate contact structure 126) of semiconductor devices (e.g., GAA FET 102 or finFET 102). In addition, the present disclosure provides example methods (e.g., method 200) of forming the ICs. In some embodiments, an interconnect line can be disposed on a contact structure and an interlayer dielectric (ILD) layer surrounding the contact structure of a semiconductor device. The interconnect line can include a barrier structure (e.g., barrier structure 134) having an interconnect portion (e.g., interconnect portion 134A) and a contact portion (e.g., contact portion 134B). The interconnect portion can surround an interconnect liner and/or plug of the interconnect line and can have a thin profile with a thickness of about 0.5 nm to about 3 nm to reduce the resistance of the interconnect line.

Due to the thin profile of the interconnect portion, there may be non-uniformity in the bottom portion thickness of the interconnect portion. The thickness non-uniformity can be on the underlying interfaces between the contact structure and the ILD layer. Such thickness non-uniformity may lead to metal diffusion from the interconnect liner and/or plug to the contact structure through top edges and/or sidewalls of the contact structure. The presence of the contact portion can prevent or minimize such metal diffusion to the contact structure and improve IC performance. The contact portion can extend from a bottom surface (e.g., bottom surface 134*s*) of the interconnect portion and surround a top portion of the contact structure, thus providing metal diffusion barrier at the top edges and/or sidewalls of the contact structure. In some embodiments, the contact portion can have a thickness of about 0.5 nm to about 2 nm and can extend a distance of about 10% to about 50% of a thickness of the ILD layer.

In some embodiments, a method includes depositing a first dielectric layer on a semiconductor device, forming a conductive structure in the first dielectric layer, removing a portion of the first dielectric layer to expose a sidewall of the conductive structure, forming a barrier structure surrounding the sidewall of the conductive structure, depositing a conductive layer on the barrier structure, and performing a polishing process on the barrier structure and the conductive layer.

In some embodiments, a method includes forming a semiconductor device and forming an interconnect structure on the semiconductor device. Forming the semiconductor device includes forming a gate structure on a substrate, depositing a dielectric layer on the gate structure, and forming a contact structure on the gate structure and in the dielectric layer. Forming the interconnect structure includes forming a barrier structure surrounding a top portion of the contact structure, depositing a liner on the barrier structure, depositing a conductive layer on the liner, and performing a polishing process on the barrier structure, the liner, and the conductive layer.

In some embodiments, a semiconductor structure includes a first dielectric layer disposed on a semiconductor device, a conductive structure disposed in the first dielectric layer, a barrier structure including a top portion and a bottom portion, a conductive liner disposed on the barrier structure, and a conductive plug disposed on the conductive liner. The top portion is disposed on the first dielectric layer and the bottom portion extends into the first dielectric layer and is disposed between the conductive structure and the first dielectric layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

depositing a first dielectric layer on a semiconductor device;

forming a conductive structure in the first dielectric layer;

removing a portion of the first dielectric layer to form a trench comprising a sidewall of the conductive structure and a sidewall of the first dielectric layer;

depositing an etch stop layer in contact with a top surface of the first dielectric layer and the sidewalls of the conductive structure and the first dielectric layer in the trench;

depositing a second dielectric layer over the etch stop layer;

removing a portion of the second dielectric layer and a portion of the etch stop layer to form an opening exposing the conductive structure and the trench;

forming a barrier structure surrounding the sidewall of the conductive structure;

depositing a conductive layer on the barrier structure; and performing a polishing process on the barrier structure and the conductive layer.

2. The method of claim 1, wherein removing the portion of the first dielectric layer comprises forming the trench surrounding the sidewall of the conductive structure.

3. The method of claim 1, wherein removing the portion of the first dielectric layer comprises etching the portion of the first dielectric layer at an interface between the first dielectric layer and the conductive structure.

4. The method of claim 1, wherein removing the portion of the first dielectric layer comprises performing a chemical mechanical polishing process on the first dielectric layer.

5. The method of claim 1, further comprising depositing the etch stop layer on the top surface of the first dielectric layer and on the sidewall of the conductive structure prior to forming the barrier structure.

6. The method of claim 1, wherein removing the portion of the etch stop layer comprises etching the portion of the etch stop layer that is in contact with the sidewall of the conductive structure prior to forming the barrier structure.

7. The method of claim 1, wherein forming the barrier structure comprises:

forming a first portion on a top surface of the conductive structure; and forming a second portion surrounding the sidewall of the conductive structure.

8. The method of claim 1, wherein forming the barrier structure comprises:

forming a first portion on a top surface of the conductive structure; and forming a second portion extending from a bottom surface of the first portion to a top surface of the first dielectric layer and surrounding the sidewall of the conductive structure.

9. The method of claim 1, wherein forming the barrier structure comprises:

forming a first portion on a top surface of the conductive structure and the first dielectric layer; and forming a second portion extending from a bottom surface of the first portion into the first dielectric layer and surrounding the sidewall of the conductive structure.

10. The method of claim 1, wherein forming the barrier structure comprises forming the barrier structure between top edges of the first dielectric layer and the conductive structure.

11. A method, comprising:

forming a semiconductor device, comprising:

forming a gate structure on a substrate;

depositing a dielectric layer on the gate structure; and forming a contact structure on the gate structure and in the dielectric layer; and forming, on the semiconductor device, an interconnect structure, comprising:

forming a trench at an interface between the dielectric layer and the contact structure and surrounding a top portion of the contact structure, wherein the trench comprises a sidewall of the contact structure and a sidewall of the dielectric layer;

depositing an etch stop layer in contact with sidewalls of the contact structure and the dielectric layer in the trench;

forming a barrier structure in the trench and surrounding a top portion of the contact structure;

depositing a liner on the barrier structure;

depositing a conductive layer on the liner; and performing a polishing process on the barrier structure, the liner, and the conductive layer.

12. The method of claim 11, wherein forming the barrier structure comprises:

forming a first portion of the barrier structure on a top surface of the dielectric layer; and forming a second portion of the barrier structure extending below the top surface of the dielectric layer by a distance of about 10% to about 50% of a height of the dielectric layer.

13. The method of claim 11, wherein forming the barrier structure comprises depositing a conductive layer in the trench surrounding the top portion of the contact structure.

14. The method of claim 11, wherein forming the barrier structure comprises depositing a conductive material in the trench that is different from conductive materials of the liner and the conductive layer.

15. The method of claim 11, further comprising removing a top portion of the etch stop layer in the trench and leaving a bottom portion of the etch stop layer in the trench.

16. The method of claim 15, wherein forming the barrier structure comprises depositing a conductive layer on the bottom portion of the etch stop layer in the trench and in contact with sidewalls of the contact structure and the dielectric layer in the trench.

17. A method, comprising:

forming a contact structure on a source/drain region;

depositing a first dielectric layer on the contact structure;

forming a conductive structure in the first dielectric layer;

etching portions of the first dielectric layer and the conductive structure to form a trench surrounding the conductive structure, wherein the trench comprises a sidewall of the conductive structure and a sidewall of the first dielectric layer;

depositing a second dielectric layer in contact with the sidewalls of the conductive structure and the first dielectric layer in the trench and on the first dielectric layer;

depositing a third dielectric layer on the second dielectric layer;

forming a barrier structure on the conductive structure and in the second and third dielectric layers; and depositing a conductive layer on the barrier structure.

18. The method of claim 17, further comprising depositing a liner on the barrier structure prior to depositing the conductive layer.

19. The method of claim 17, wherein forming the barrier structure comprising depositing a conductive material.

20. The method of claim 17, wherein forming the barrier structure comprising depositing a portion of the barrier structure surrounding the conductive structure.

* * * * *